United States Patent
Ralph et al.

(10) Patent No.: US 9,691,458 B2
(45) Date of Patent: Jun. 27, 2017

(54) CIRCUITS AND DEVICES BASED ON SPIN HALL EFFECT TO APPLY A SPIN TRANSFER TORQUE WITH A COMPONENT PERPENDICULAR TO THE PLANE OF MAGNETIC LAYERS

(71) Applicant: Cornell University, Ithaca, NY (US)

(72) Inventors: Daniel C. Ralph, Ithaca, NY (US); Robert A. Buhrman, Ithaca, NY (US)

(73) Assignee: Cornell University, Ithaca, NY (US)

(*) Notice: Subject to any disclaimer, the term of this patent is extended or adjusted under 35 U.S.C. 154(b) by 0 days.

(21) Appl. No.: 15/030,291

(22) PCT Filed: Oct. 20, 2014

(86) PCT No.: PCT/US2014/061410
§ 371 (c)(1),
(2) Date: Apr. 18, 2016

(87) PCT Pub. No.: WO2015/102739
PCT Pub. Date: Jul. 9, 2015

(65) Prior Publication Data
US 2016/0276006 A1    Sep. 22, 2016

Related U.S. Application Data

(60) Provisional application No. 61/892,850, filed on Oct. 18, 2013.

(51) Int. Cl.
*G11C 11/00*   (2006.01)
*G11C 11/16*   (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC ............................................. G11C 11/14–11/16
(Continued)

(56) References Cited

U.S. PATENT DOCUMENTS

2006/0221509 A1   10/2006   Carey et al.
2009/0161265 A1   6/2009   Sugano et al.
(Continued)

FOREIGN PATENT DOCUMENTS

JP   2012511152 A   5/2012
WO   2013025994 A2   2/2013

*Primary Examiner* — Han Yang
(74) *Attorney, Agent, or Firm* — Perkins Coie LLP

(57) ABSTRACT

A device based on a spin Hall effect and spin-transfer torque (STT) effect is provided to include a magnetic tunneling junction (MTJ) element including a free magnetic layer structured to have a magnetization direction that can be changed by spin-transfer torque; an electrically conducting magnetic layer structure exhibiting a spin Hall effect (SHE) and, in response to an applied in-plane charge current, generating a spin-polarized current of a magnetic moment oriented in a predetermined direction having both an in-plane magnetic moment component parallel to a surface of the electrically conducting magnetic layer structure and a perpendicular magnetic moment component perpendicular to the surface of the electrically conducting magnetic layer structure. The magnetization direction of the free magnetic layer is capable of being switched by the spin-polarized current via a spin-transfer torque (STT) effect. This device can be configured in a 3-terminal configuration.

32 Claims, 28 Drawing Sheets

(51) Int. Cl.
    *H01L 43/08*      (2006.01)
    *H01L 27/22*      (2006.01)
    *G11C 11/18*      (2006.01)
    *H01F 10/32*      (2006.01)
    *H01L 43/06*      (2006.01)

(52) U.S. Cl.
    CPC ............ *G11C 11/18* (2013.01); *H01F 10/329* (2013.01); *H01F 10/3263* (2013.01); *H01L 27/222* (2013.01); *H01L 27/226* (2013.01); *H01L 43/08* (2013.01); *H01F 10/3286* (2013.01); *H01L 43/06* (2013.01)

(58) Field of Classification Search
    USPC .................................. 365/148, 158, 171, 173
    See application file for complete search history.

(56) References Cited

U.S. PATENT DOCUMENTS

| | | | |
|---|---|---|---|
| 2010/0097063 A1* | 4/2010 | Ando | ..................... B82Y 10/00 |
| | | | 324/316 |
| 2013/0015542 A1 | 1/2013 | Wang et al. | |
| 2015/0041934 A1* | 2/2015 | Khvalkovskiy | ......... H01L 43/02 |
| | | | 257/421 |

* cited by examiner

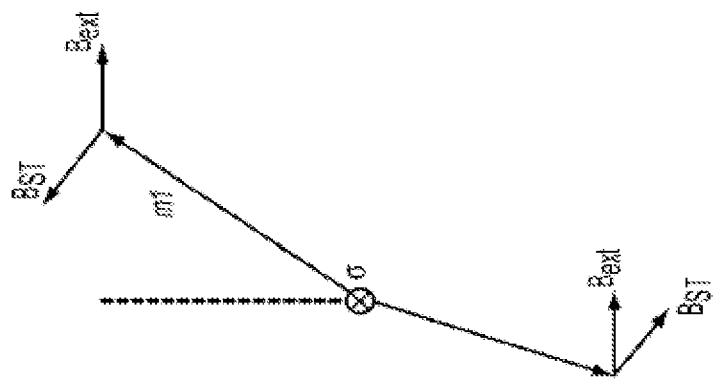
FIG. 12D
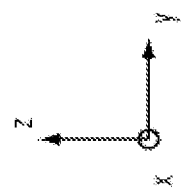
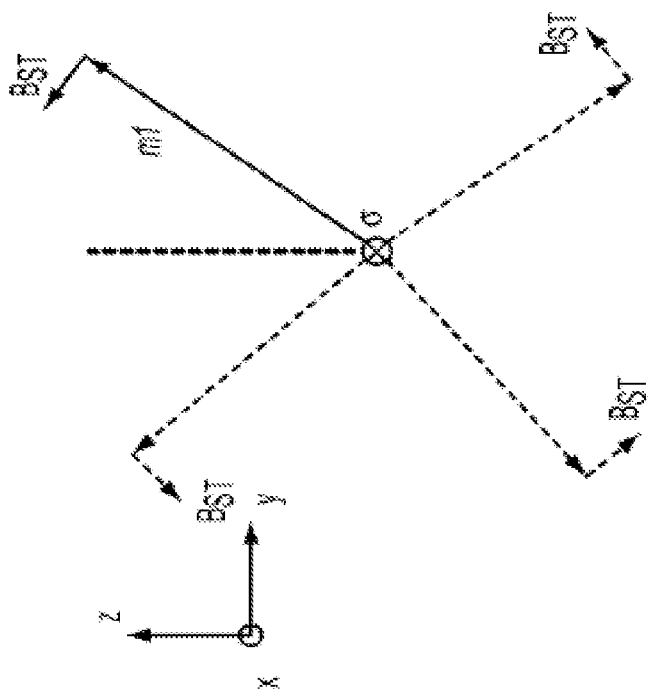
FIG. 12C

FIG. 15A (Write Operation)

FIG. 15B (Read Operation)

CIRCUITS AND DEVICES BASED ON SPIN HALL EFFECT TO APPLY A SPIN TRANSFER TORQUE WITH A COMPONENT PERPENDICULAR TO THE PLANE OF MAGNETIC LAYERS

PRIORITY CLAIM AND RELATED PATENT APPLICATION

This patent document is a 35 USC §371 National Stage application of International Application No. PCT/US2014/061410 filed Oct. 20, 2014, which further claims the priority of U.S. Provisional Application No. 61/892,850 entitled "CIRCUITS AND DEVICES BASED ON SPIN HALL EFFECT TO APPLY A SPIN TRANSFER TORQUE WITH A COMPONENT PERPENDICULAR TO THE PLANE OF MAGNETIC LAYERS" and filed on Oct. 18, 2013, the entirety of which is incorporated by reference as part of the disclosure of this patent document.

STATEMENT REGARDING FEDERALLY SPONSORED RESEARCH OR DEVELOPMENT

This invention was made with government support by the National Science Foundation (NSF) under contract number DMR-1120296 and by the Army Research Office (ARO) under contract number W911NF-08-2-0032. The government has certain rights in this invention.

TECHNICAL FIELD

This patent document relates to circuits and devices having magnetic materials or structures based on electron spin torque effects and their applications, including non-volatile magnetic memory circuits, non-volatile logic devices, and spin-torque excited nanomagnet oscillators.

BACKGROUND

Electrons and other charged particles process spins as one of their intrinsic particle properties and such a spin is associated with a spin angular momentum. A spin of an electron has two distinctive spin states. Electrons in an electrical current may be unpolarized by having the equal probabilities in the two spin states. The electrons in an electrical current are spin polarized by having more electrons in one spin state than electrons in the other spin state. A spin-polarized current can be achieved by manipulating the spin population via various methods, e.g., by passing the current through a magnetic layer having a particular magnetization. In various magnetic microstructures, a spin-polarized current can be directed into a magnetic layer to cause transfer of the angular momenta of the spin-polarized electrons to the magnetic layer and this transfer can lead to exertion of a spin-transfer torque (STT) on the local magnetic moments in the magnetic layer and precession of the magnetic moments in the magnetic layer. Under a proper condition, this spin-transfer torque can cause a flip or switch of the direction of the magnetization of the magnetic layer.

The above spin-transfer torque (STT) effect can be used for various applications including STT magnetic random access memory (MRAM) circuits and devices. For example, a STT-MRAM circuit can include a magnetic tunnel junction (MTJ) as a magnetoresistive element formed of two or more thin film ferromagnetic layers or electrodes, which are usually referred to as the free magnetic layer or free magnetic layer (FL) having a magnetic moment that can be switched or changed and the pinned magnetic layer (PL) whose magnetic moment is fixed in direction. The free magnetic layer (FL) and the pinned magnetic layer (PL) are separated by an insulating barrier layer (e.g., a MgO layer) that is sufficiently thin to allow electrons to transit through the barrier layer via quantum mechanical tunneling when an electrical bias voltage is applied between the electrodes. The electrical resistance across the MTJ depends upon the relative magnetic orientations of the PL and FL layers. The magnetic moment of the FL can be switched between two stable orientations in the FL. The resistance across the MTJ exhibits two different values under the two relative magnetic orientations of the PL and FL layers, which can be used to represent two binary states "1" and "0" for binary data storage, or, alternatively, for binary logic applications. The magnetoresistance of this element is used to read out this binary information from the memory or logic cell.

SUMMARY

In one aspect, a device based on a spin Hall effect and spin-transfer torque (STT) effect is provided to include a magnetic tunneling junction (MTJ) element including a free magnetic layer, a fixed magnetic layer, and a tunnel barrier layer sandwiched between the free magnetic layer and the fixed magnetic layer, the free magnetic layer structured to have a magnetization direction that can be changed by spin-transfer torque; an electrically conducting magnetic layer structure exhibiting a spin Hall effect (SHE) and, in response to an applied in-plane charge current, generating a spin-polarized current of a magnetic moment oriented in a predetermined direction having both an in-plane magnetic moment component parallel to a surface of the electrically conducting magnetic layer structure and a perpendicular magnetic moment component perpendicular to the surface of the electrically conducting magnetic layer structure. The magnetization direction of the free magnetic layer is capable of being switched by the spin-polarized current via a spin-transfer torque (STT) effect.

In another aspect, a magnetic tunneling junction memory device based on a spin Hall effect and spin-transfer torque (STT) effect in a three-terminal circuit configuration is provided to include an array of memory cells for storing data; and a memory control circuit coupled to the array of memory cells and operable to read or write data in the memory cells. Each memory cell includes a magnetic tunneling junction (MTJ) that includes (1) a pinned magnetic layer having a fixed magnetization direction, (2) a free magnetic layer having a magnetization direction that is changeable, and (3) a non-magnetic junction layer between the magnetic free layer and the pinned magnetic layer and formed of an insulator material sufficiently thin to allow tunneling of electrons between the magnetic free layer and the pinned magnetic layer; a spin Hall effect metal layer structure that includes a metal exhibiting a large spin Hall effect to react to a charge current directed into the spin Hall effect metal layer to produce a spin-polarized current that is perpendicular to the charge current and has spin polarization components that are perpendicular and parallel to the layers of MTJ, the spin Hall effect metal layer structure being parallel to and adjacent to the free magnetic layer to direct the spin-polarized current generated in the spin Hall effect metal layer into the free magnetic layer; a first electrical terminal in electrical contact with the MTJ from a side having the pinned magnetic layer; and second and third electrical terminals in electrical contact with two contact locations of the spin Hall effect metal layer structure on two opposite sides of the free magnetic layer to supply the charge current in the spin Hall effect metal layer structure. The memory control circuit is configured to be operable in a writing mode to apply the charge current in the spin Hall effect metal layer structure to set or switch the magnetization direction of the free magnetic layer to a desired direction for representing a stored bit. The memory control circuit is further configured to be operable in a read mode to apply a read voltage to the first electrical terminal to supply a read current tunneling across the MTJ between the first electrical terminal and the spin Hall effect metal layer structure, without switching the magnetization direction of the free magnetic layer, to sense the magnetization direction of the free magnetic layer that represents the stored bit in the MTJ.

In another aspect, the techniques and devices disclosed in this document provide 3-terminal magnetic circuits and devices based on the spin-transfer torque (STT) effect via a combination of injection of spin-polarized electrons or charged particles by using a charge current in a spin Hall effect metal layer coupled to a free magnetic layer and application of a gate voltage to the free magnetic layer to manipulate the magnetization of the free magnetic layer for various applications, including non-volatile memory functions, logic functions and others. The charge current is applied to the spin Hall effect metal layer via first and second electrical terminals and the gate voltage is applied between a third electrical terminal and either of the first and second electrical terminals. The spin Hall effect metal layer can be adjacent to the free magnetic layer or in direct contact with the free magnetic layer to allow a spin-polarized current generated via a spin Hall effect under the charge current to enter the free magnetic layer. The disclosed 3-terminal magnetic circuits can also be applied to signal oscillator circuits and other applications. In one implementation, a magnetic tunnel junction (MTJ) memory cell can be constructed in a 3-terminal circuit configuration for non-volatile magnetic memory application and can be operated to use the combined operation of the charge current in the spin Hall effect metal layer and the gate voltage to the free magnetic layer to effectuate the magnetization switching of the free magnetic layer in a write operation. The reading of the MTJ memory cell can be done by applying a read voltage across the MTJ. In another implementation, a magnetic tunnel junction (MTJ) in this 3-terminal circuit configuration can also be used to form a signal oscillator based on the magnetic precession in the free magnetic layer caused by the spin torque caused by the spin-polarized current induced by the charge current in the spin Hall effect metal layer and a sensing current can be applied across the MTJ to be modulated by the oscillation of the resistance of the MTJ due to the magnetic precession in the free magnetic layer, thus generating an oscillation signal. The frequency and amplitude of the generated oscillation signal can be used to controlling the sensing current across the MTJ.

In yet another aspect, a circuit based on a spin Hall effect is provided to include a multi-layer magnetic stack including layers one of which is a magnetic free layer with perpendicular magnetic anisotropy, the magnetic free layer structured to have a magnetization direction to be changed via spin torque transfer; a non-magnetic layer in contact with the magnetic free layer of the multi-layer magnetic stack; an electrically conducting layer formed of or including a ferromagnetic material exhibiting a spin Hall effect (SHE) and in contact with the non-magnetic layer; and a device circuit coupled to the multi-layer magnetic stack and the electrically conducting layer formed of the ferromagnetic material to supply a current in the electrically conducting layer to inject spins having a strong component perpendicular to the layers of the device. In one implementation, the multi-layer magnetic stack includes a magnetic tunneling junction (MTJ) that includes (1) a pinned magnetic layer having a fixed magnetization direction, (2) the magnetic layer free layer, and (3) a non-magnetic junction layer between the magnetic free layer and the pinned magnetic layer.

The above and other features, and exemplary implementations and applications, are described in greater detail in drawings, the description and the claims.

BRIEF DESCRIPTION OF DRAWINGS

FIG. 12C shows a diagram illustrating the direction of an effective spin torque field $B_{ST}$ under different orientations of a FL magnetic moment. The injected spins are assumed to be along the −x direction as an example.

FIG. 12D shows a diagram illustrating the relationship between the direction of the effective spin torque field $B_{ST}$ and that of the applied field $B_{ext}$.

DETAILED DESCRIPTION

The techniques and devices disclosed in this document provide magnetic circuits and devices based on the spin-transfer torque (STT) effect via injection of spin-polarized electrons or charged particles by using a charge current in a spin Hall effect (SHE) metal layer coupled to a magnetic free layer for various applications, including non-volatile memory functions, logic functions and others. The spin Hall effect metal layer can be located adjacent to the free magnetic layer or in direct contact with the magnetic free layer. The charge current is applied to the spin Hall effect metal layer via first and second electrical terminals at two different locations of the spin Hall effect metal layer to generate a spin-polarized current via a spin Hall effect to enter the magnetic free layer. The injected spin-polarized current in the magnetic free layer can cause the magnetization direction of the magnetic free layer to change based on the spin-transfer torque (STT) effect. This SHE-based STT is different from the STT process using a fixed or pinned ferromagnetic layer as a spin polarization layer to control the spin of an injected current passing through the fixed or pinned ferromagnetic layer and, notably, can have a higher transfer efficiency and produce stronger spin-transfer torque in the magnetic free layer. As such, a lower charge current can be used in the SHE-based STT design to achieve the same STT effect which requires a higher driving current in the STT process using a fixed or pinned ferromagnetic layer as a spin polarization layer.

Figure 1:
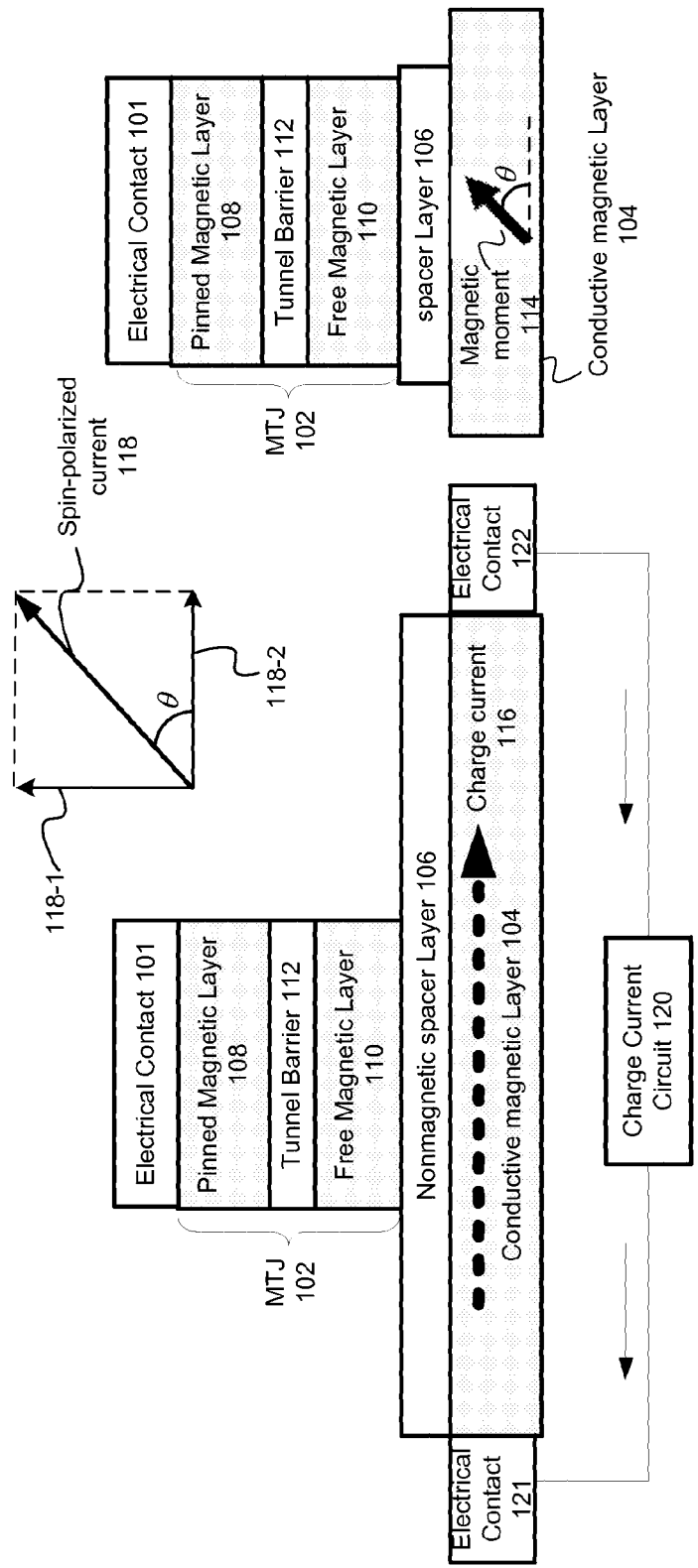
FIG. 1 includes FIGS. 1A and 1B and shows an example of a magnetic tunneling junction (MTJ) device structure having a conductive magnetic layer exhibiting spin Hall effect (SHE) and configured to effectuate a spin-transfer torque having a component in the direction perpendicular to the device plane.

FIG. 1A in FIG. 1 shows an example of a magnetic tunneling junction (MTJ) device structure 100 having a conductive SHE layer exhibiting spin Hall effect. The device structure 100 includes a top electrical contact 101 in contact with a MTJ 102, a conductive SHE layer 104, and a nonmagnetic spacer layer 106 coupled between MTJ 102 and conductive magnetic layer 104. MTJ 102 further includes a pinned (or "reference") magnetic layer 108, a free magnetic layer 110 in contact with electrical contact 101, and a tunnel barrier layer 112 sandwiched between and in contact with both the pinned and free magnetic layers. The multiple layers in MTJ 102, the conductive SHE layer 104, and nonmagnetic spacer layer 106, having specific selection of the materials and dimensions, are configured to provide a desired interfacial electronic coupling between the free magnetic layer and conductive SHE layer 104 to allow a large flow of spin-polarized electrons or charged particles in conductive SHE layer 104 in response to a given charge current injected into conductive SHE layer 104 and to provide efficient injection of the generated spin-polarized electrons or charged particles into the free magnetic layer of MTJ 102. Two electrical contacts 121 and 122 are placed at two locations of the conductive SHE layer 104 and are coupled to a charge current circuit 120 to supply the charge current 116 to the conductive SHE layer 104. In implementations, the free and pinned magnetic layers 108 and 110 may have a magnetization that is perpendicular to the layers or a magnetization that is parallel to the layer.

In addition to the two electrical terminals formed by the two electrical contacts 121 and 122, the SHE-based MTJ device structure 100 in FIG. 1A has a third electrical terminal by the electrical contact 101 on the top of the MTJ 102. Therefore, different from other STT-MTJ devices using a fixed or pinned ferromagnetic layer as a spin polarization layer, the SHE-based MTJ device structure 100 is a three-terminal device with two circuits—the first circuit is the charge current circuit formed by the two terminals 121 and 122 with the conductive SHE layer 104, and the second circuit is an MTJ circuit coupled to the MTJ 102 via the first electrical contact 101 on the top of the MTJ 102 and either one of the contacts 121 and 122.

The two circuits in FIG. 1A can operate independently from each other in some implementations. For example, the charge current circuit is activated to perform a writing operation to write new date into the MTJ 102 by using the SHE charge current to flip the free layer 110 while the MTJ circuit is used as a sensing circuit in reading the stored data in the MTJ 102 with a low read current flowing across the MTJ 102 without changing the magnetization of the free layer 110 in the MTJ 102.

In other implementations, the two circuits in FIG. 1 can operate together or collectively at the same time to achieve a desired operation. For example, the 3-terminal magnetic circuit in FIG. 1A can achieve enhanced spin-transfer torque (STT) via a combination of (1) injection of spin-polarized electrons or charged particles by using a charge current in a spin Hall effect metal layer and (2) application of a gate voltage to the free magnetic layer to manipulate the magnetization of the free magnetic layer for various applications, including non-volatile memory functions, logic functions and others.

The disclosed MRAM cell employing the SHE as the writing mechanism avoids running a large writing current through the tunnel barrier of the MTJ 102 in the example in FIG. 1A because the charge current 106 in the conductive SHE layer 106 is primarily responsible for flipping the magnetization of the free layer 110 in a writing operation. This feature can greatly increase the lifetime of the memory cell and greatly ease the reproducibility margins needed to achieve reliable reading and writing. In many two-terminal ST-MRAM devices based on the STT process using a fixed or pinned ferromagnetic layer as a spin polarization layer, both the writing and reading operation rely on running a current through the tunneling barrier and this has an undesirable trade-off in order to get a large tunneling magnetoresistance and at the same time allow for a large current to flow through the barrier. In many cases, it can be difficult to satisfy these two requirements simultaneously. The three-terminal MRAM cell that uses the SHE as the writing mechanism avoids such issues and enables optimization of the device performance of the MTJ for the reading operation alone without affecting the writing operation. Therefore, the disclosed 3-terminal devices using SHE-based SST provide considerable freedom in the design of the MTJ, for example, the thickness of the tunnel barrier can be adjusted to get the optimum tunneling magnetoresistance and the appropriate impedance match with the circuitry that provides the write currents and the circuitry that reads the sensing voltage.

Notably, the SHE-based MTJ device structure 100 in FIG. 1A is configured so that the spin polarization of the injected charged particles or electrons have a spin polarization component that is perpendicular to the magnetic layers of the MTJ 102. The conductive SHE layer 106 in the SHE-based MTJ device structure 100 in FIG. 1A is configured to render the spin polarization of the injected charged particles or electrons at an angle with respect to the magnetic layers of the MTJ 102. In some implementations, this angle is at or around 45 degrees. This is illustrated in FIG. 1B of FIG. 1. The conductive SHE layer 106 can be implemented as a conductive magnetic layer that exhibits the SHE effect and provides the desired spin polarization direction at a desired angle between 0 degree and 90 degrees with respect to the magnetic layers of the MTJ 102. Alternatively, the conductive SHE layer 106 can be implemented as a multi-layer structure that includes a non-magnetic conductive layer that exhibits the SHE effect and a separate magnetic layer that rotates the spin polarization direction of the injected charged particles to be at a desired angle between 0 degree and 90 degrees with respect to the magnetic layers of the MTJ 102.

In the design and development of spin-transfer-torque magnetic random access memory (STT-MRAM) and STT magnetic logic devices, magnetic free layers with perpendicular magnetic anisotropy (PMA) can be advantageously used for certain circuit or device applications. For example, for a given degree of thermal stability, free layers with PMA can undergo anti-damping switching driven by spin-transfer torque using smaller values of applied spin torque compared to layers with in-plane anisotropy. This is because for devices with PMA the critical torque for switching is typically directly proportional to the anisotropy energy barrier that determines thermal stability, whereas for devices with in-plane magnetic anisotropy, the critical torque for switching is typically increased by an additional term proportional to the demagnetization field, a term that does not contribute to thermal stability. This difference makes devices with PMA in principle more energy efficient. For another example, PMA structures can also be scaled down to smaller sizes while remaining thermally stable than devices with in-plane anisotropy, which should enable memories and logic circuits with greater density.

One efficient way for applying a spin-transfer torque to a magnetic layer is to use the spin Hall effect in a material with strong spin orbit coupling to generate a current that flows perpendicular to an applied charge current, and to have this spin-polarized current be absorbed by an adjacent magnetic layer to apply a spin torque. This effect can be used to switch in-plane polarized magnetic layers through an anti-damping mechanism.

However, the spin Hall effect by itself may not be sufficient for producing efficient anti-damping spin-torque switching of magnetic layers with PMA because the dominant component of spin torque produced by the spin Hall effect is generally oriented within the sample plane. For anti-damping switching of a layer with PMA, there needs to be a strong component of spin torque oriented perpendicular to the sample plane. The spin Hall effect can be used to switch layers with PMA by a mechanism in which the spin torque overcomes the anisotropy field. However, this approach would generally require larger spin torques and hence large charge currents. In order to combine the use of efficient spin Hall torque generation with efficient anti-damping switching of PMA layers, there is a need to provide circuits and devices through which the spin Hall effect can be used to generate a strong spin-transfer torque with a component oriented perpendicular to the sample plane.

The circuits and devices having magnetic materials or structures based on electron spin torque effects described in this patent document are so structured that the spin-transfer torque vector has a strong component in a direction perpendicular to the device plane and also a component in the device plane. Due to this unique spin-transfer torque vector orientation, the devices and circuits based on the disclosed technology can be used in various applications.

In the example in FIG. 1, the conductive magnetic layer 104 can include a ferromagnetic material. In other implementations, conductive magnetic layer 104 can include other types of magnetic materials such as a ferrimagnetic material. In some embodiments, conductive magnetic layer 104 is constructed so that the net magnetic moment or magnetization of the conductive magnetic layer 104 is orientated out-of-plane at an angle between the direction parallel to the device layer surfaces (referred to as "0 degrees" or "in-plane direction") and the direction perpendicular to the device layer surfaces (referred to as "90 degrees" or "vertical direction"). The net magnetic moment is indicated by an arrow 114 in FIG. 1 viewed from the end of the device and an angle θ between the magnetic moment and the in plane direction (θ not equal to either 0 or 90 degrees). For example, one embodiment of the device has the angle θ at approximately 45 degrees.

When an in-plane charge current 116 is passed through conductive magnetic layer 104, for example, along the x-direction, the spin Hall effect intrinsic to conductive magnetic layer 104 causes electrons with different spin orientations to deflect in different transverse directions, generating a spin-polarized current. The net spin orientation of this spin-polarized current (or "spin current")118 is either parallel or antiparallel to the magnetic moment 114 of conductive magnetic layer 104. As such, the spin-polarized current 118, and hence the spin-transfer torque transmitted through the non-magnetic spacer layer and onto the free magnetic layer, will have both an in-plane component and a perpendicular component. This is shown in FIG. 1 as the vertical projection 118-1 and in-plane projection 118-2 of spin-polarized current 118. The benefits of having a vertical spin-transfer torque in device 100 is described in more detail below in conjunctions with various embodiments of device 100.

In device 100, each of the free magnetic layer or the pinned magnetic layer can be a single layer of a suitable magnetic material or a composite layer with two or more layers of different materials. The free magnetic layer and the pinned magnetic layer can be electrically conducting while the barrier layer between them is electrically insulating and sufficiently thin to allow for electrons to pass through via tunneling. The conductive magnetic layer 104 can be adjacent to the free magnetic layer or in direct contact with the free magnetic layer to allow the spin-polarized current generated via a spin Hall effect under the charge current to enter the free magnetic. Moreover, conductive magnetic layer 104 can be implemented as a single layer of a suitable magnetic material exhibiting spin Hall effect, or a composite layer with two or more layers of different materials.

Various embodiments disclosed in this patent document provide device structures which are configured to utilize anomalous Hall effect, which combines the physics of the spin Hall effect with ferromagnetism or ferrimagnetism, to facilitate anti-damping switching of magnetic layers with PMA. Embodiments in conjunction with FIGS. 2-7 below provide six detailed embodiments based on the device structure 100 in FIG. 1 to effectuate a spin-transfer torque having a component in the direction perpendicular to the device plane or the plane of the layers.

Figure 2:
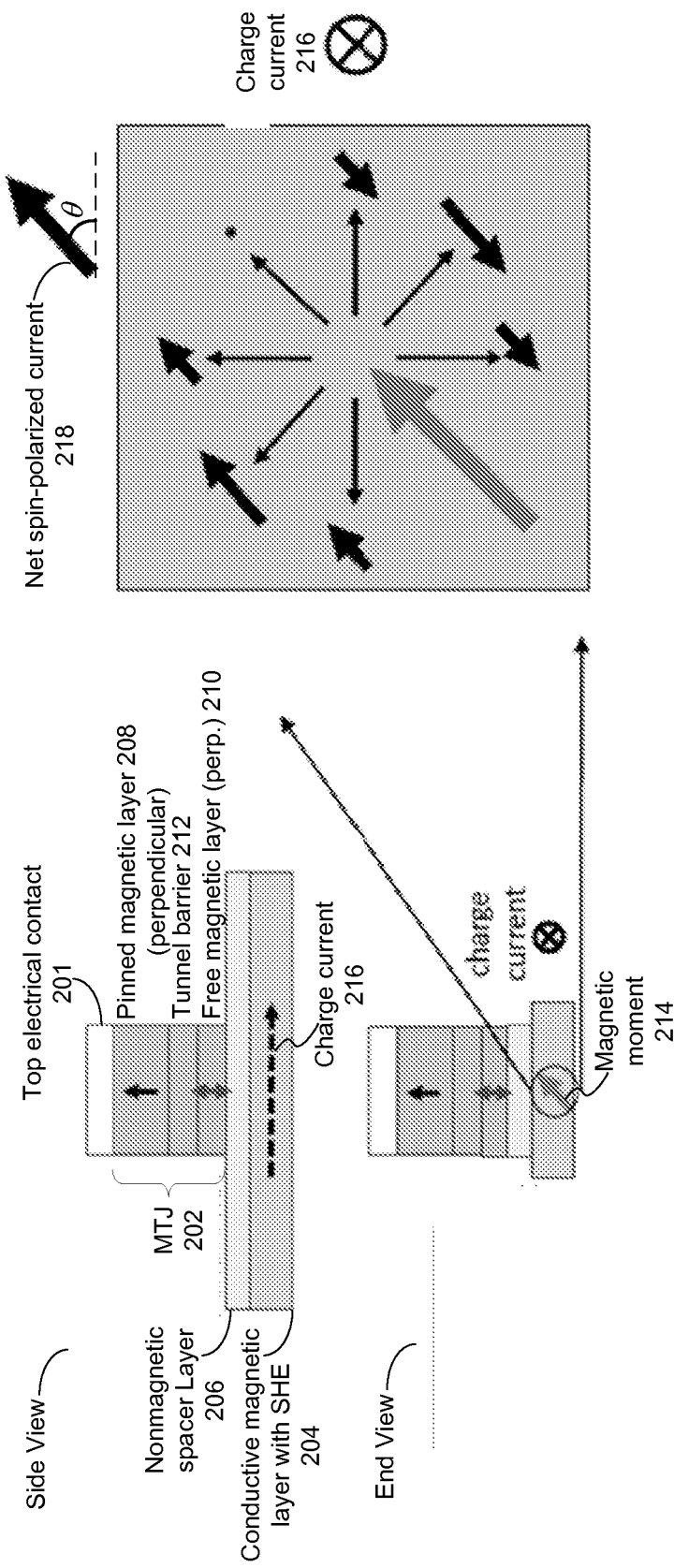
FIG. 2 shows a schematic of an exemplary device structure that supports anti-damping switching of a magnetic free layer having perpendicular magnetic anisotropy.

For example, FIG. 2 shows a schematic of an exemplary device structure 200 that supports anti-damping switching of an magnetic free layer having perpendicular magnetic anisotropy. More specifically, FIG. 2 provides two views of the same device structure 200: one side view on the top of FIG. 2 displaying the long side of the conductive magnetic layer and one end view at the bottom of FIG. 2 displaying the short side of the conductive magnetic layer. As can be seen in the side view of device structure 200, device structure 200 includes a top electrical contact 201 in contact a MTJ 202, a conductive magnetic layer 204, and a non-magnetic spacer layer 206. MTJ 202 further includes a pinned (or "reference") magnetic layer 208, a free magnetic layer 210 in contact with top electrical contact 201, both magnetic layers 208 and 210 are structured to having a perpendicular magnetic anisotropy, and a tunnel barrier layer 212 sandwiched between and in contact with both the pinned and free magnetic layers. In the embodiment shown, pinned magnetic layer 208 also has a perpendicular magnetization pointing upward (but can also point downward in other embodiments). Free magnetic layer 210 also has a perpendicular magnetization but its orientation can be changed between an up state and a down state depending on the applied spin-transfer torque.

A conductive magnetic layer 204 is positioned at the bottom of device structure 200 and coupled to free magnetic layer 210 of MTJ 202 through nonmagnetic spacer 206 disposed between conductive magnetic layer 204 and free magnetic layer 210. Nonmagnetic spacer 206 may be made of a metallic material. Conductive magnetic layer 204 is made of an electrically-conducting magnetic material, such as a ferromagnetic material having strong spin-orbit coupling, in which the magnetic moment is tilted out of plane by an angle θ (not equal to either 0 or 90 degrees). However, conductive magnetic layer 204 can be made of other types of magnetic materials such as a ferrimagnetic material. The orientation of magnetic moment 214 of conductive magnetic layer 204 is illustrated as a red arrow in the end view of device structure 200. Note that the orientation of the magnetic moment 214 can be set in a number of ways, such as by exchange biasing, by an magnetic anisotropy engineered to stabilize the magnetization at the desired angle, or by the application of an external magnetic field.

To cause spin Hall effect in device structure 200, an exemplary in-plane charge current 216 passing through conductive magnetic layer 204 along the long side of the device may be used (shown as a dashed black arrow in the end view of device structure 200). Typically, when an in-plane charge current is passed through a bottom layer having the spin Hall effect, the spin Hall effect causes electrons with different spin orientations to deflect in different transverse directions. In contrast, in a ferromagnetic material, the in-plane charge current generally does not cause the generation of a spin-polarized current with the spin oriented perpendicular to the overall magnetic moment. Consequently, in conductive magnetic layer 204 which is both ferromagnetic and has a spin Hall effect, the ferromagnetism will effectively cause the spin-polarized currents generated by the spin Hall effect to be either parallel or antiparallel to the magnetic moment 214. The two types of spin-polarized currents are illustrated by the two sets of black arrows in the inset figure on the right side of FIG. 2, respectively. As a result, the net spin-polarized current 218 generated in conductive magnetic layer 204 will point either parallel or antiparallel (depending on the direction of the charge current 216) to the magnetic moment 214 of conductive magnetic layer 204, which is tilted out of plane by the angle θ, rather than in the plane of conductive magnetic layer 204. In the example of FIG. 2, the orientation of the net spin-polarized current 218 points upward and parallel to magnetic moment 214. As such, the generated spin-polarized current 218 has a component perpendicular to the planes of the device layers (i.e., pointing upward).

The generated spin-polarized current 218 can be transmitted through the typically thin nonmagnetic-metal layer 206 to apply a spin-transfer torque on the free magnetic layer 210, such that the applied spin torque can have strong components both perpendicular to the device plane and in the device plane, with the relative strength depending on the angle θ. In some embodiments, the strength of the perpendicular component of the spin-transfer torque is approximately proportional to $(\theta_{SH,\uparrow}+\theta_{SH,\downarrow})\cos\theta\sin\theta$, where $\theta_{SH,\uparrow}$ corresponds to the ratio of the transverse majority spin current density to the applied charge current density (note that this transverse spin density flows perpendicular to both the magnetic moment and the charge current density) and $\theta_{SH,\downarrow}$ is the analogous quantity for minority spins. In these embodiments, the perpendicularly-oriented spin torque may be maximized near an angle of θ≈45°. The strength of the torque can also depend on the degree to which the material interfaces are "transparent" to spin transmission. The higher the transmission of the generated spin-polarized current through nonmagnetic-metal layer 206, the higher the applied spin-transfer torque will be on the free magnetic layer 210, so is the perpendicularly-oriented component. Note that the sign of the perpendicular-oriented component of spin-transfer torque may be reversed by reversing the charging current, providing a mechanism for switching magnetic free layer 210 back and forth between its up and down configurations. In some embodiments, device structure 200 can achieve a switching time from a few ns to 10 s of ns.

Figure 3:
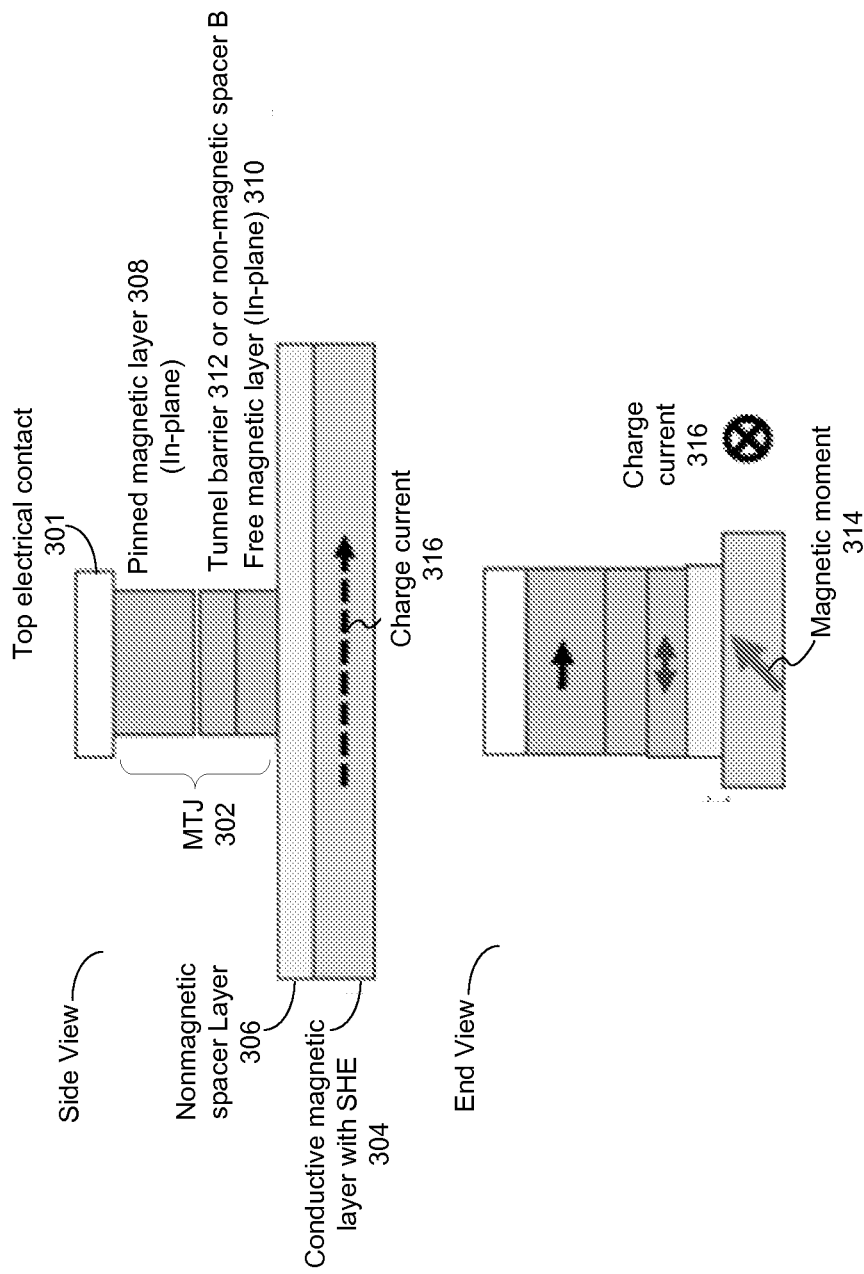
FIG. 3 shows a schematic of an exemplary device structure for using at least the perpendicular spin-transfer torque from the spin Hall effect to drive precessional magnetic reversal of an in-plane free magnetic layer.

For high-speed and low-total-energy magnetic memory and logic applications, it can be advantageous to use an in-plane-polarized magnetic free layer and to drive switching by applying a short pulse of perpendicularly-oriented spin torque (or a combination of perpendicular and in-plane torque) to achieve precessional reversal of the free layer. FIG. 3 shows a schematic of an exemplary device structure 300 for using at least the perpendicular spin torque from the spin Hall effect to drive precessional magnetic reversal of an in-plane free magnetic layer. Similarly to FIG. 2, FIG. 3 provides two views of the same device structure 300: one side view on the top of FIG. 3 displaying the long side of the conductive magnetic layer and one end view at the bottom of FIG. 3 displaying the short side of the conductive magnetic layer. The side view also shows the in-plane charge current 316 passing through the conductive magnetic layer 304. The end view also shows the orientation of magnetic moment 314 of conductive magnetic layer 304.

Device structure 300 also has substantially the same multi-layer structure as device structure 200, which includes a top electrical contact 301, a MTJ 302, a conductive magnetic layer 304 (which can be made of a ferromagnetic material or a ferrimagnetic material), and a nonmagnetic spacer layer 306. MTJ 302 further includes a pinned magnetic layer 308 and a free magnetic layer 310, and, a tunnel barrier layer 312 sandwiched between and in contact with both the pinned and free magnetic layers. However, in device structure 300, pinned magnetic layer 308 has an in-plane magnetization pointing to the right (but can also point to the left in other embodiments). Free magnetic layer 310 also has an in-plane magnetization but its orientation can be changed between parallel to and antiparallel to the magnetization of layer 308 depending on the applied spin-transfer torque. The combination of the perpendicular and in-plane components of spin-transfer torque produced by the anomalous Hall effect may be used to drive the switching of the in-plane magnetization of free magnetic layer 310 at low current levels (with respect to conventional magnetic tunnel junctions). In some embodiments, the threshold current for the magnetization switching can be less than 50 μA. The magnetic moment 314 can be switched back and forth between its two stable in-plane orientations by applying pulses of positive or negative in-plane current. In some embodiments, device structure 300 can achieve a switching time of a few ns or shorter. Some embodiments of device structure 300 have shown switching time of 50 ps.

In the examples in FIGS. 2 and 3, the free layer is shown to have one magnetic domain. In some implementations, the ST-MRAM magnetic memory devices based on the design in FIG. 1 may use a magnetic free layer including two or more different magnetic domains in which adjacent domains are structured to have opposite magnetization directions and a magnetic domain wall between two adjacent magnetic domains is changeable in position within the magnetic free layer. Such magnetic domains may have magnetization directions that are parallel to the magnetic free layer or perpendicular to the magnetic free layer. The SHE-injected spin-polarized current can be used to shift the position of such a domain wall by shifting one domain in one magnetization under the MTJ junction to achieve one digital state and an adjacent domain in the opposite magnetization under the MTJ junction to achieve another digital state.

Figure 4A:
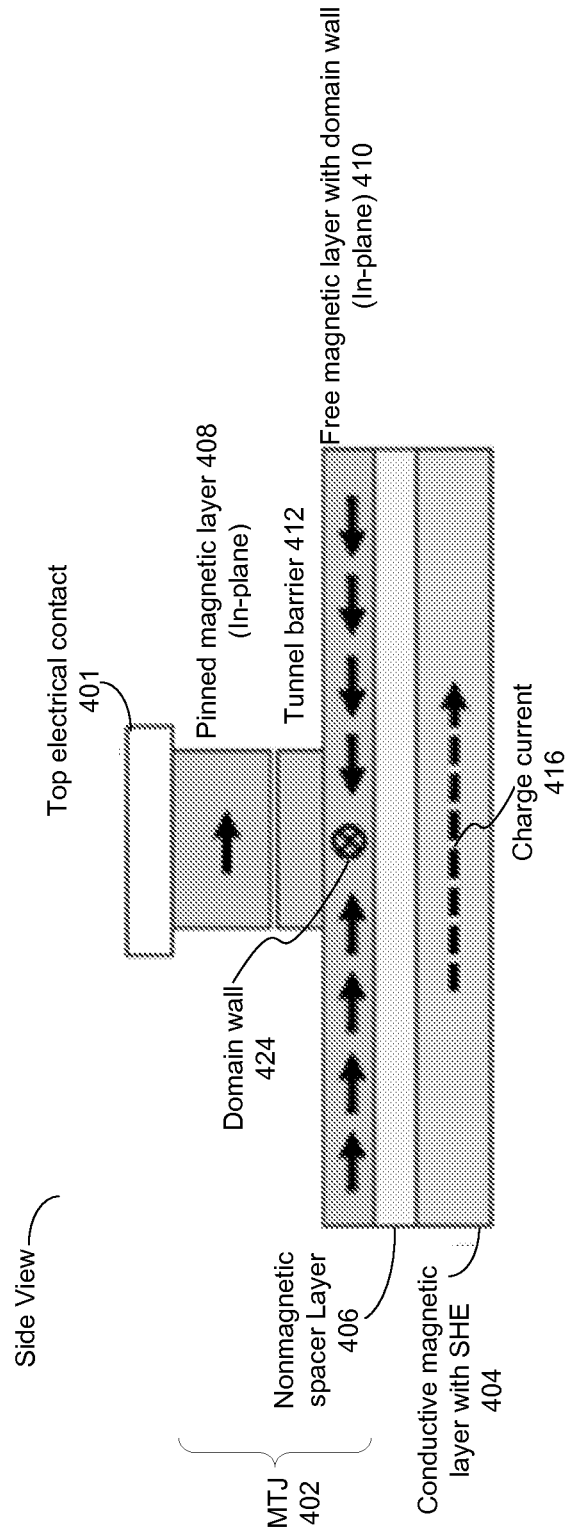
FIGS. 4A, 4B and 4C show examples of MTJ device structures for using at least the perpendicular spin torque from the spin Hall effect to manipulate a magnetic domain wall within the magnetic free layer of an MTJ.

FIG. 4A shows a schematic of an exemplary device structure 400 for using at least the perpendicular spin torque from the spin Hall effect to manipulate a magnetic domain wall within the in-plane magnetic free layer. Such a device structure can also be used to build magnetic memory based on changing the domain wall location from one side of the magnetic free layer to the other side of the magnetic free layer. The device structure 400 has substantially the same multi-layer structure as device structure 300, which includes a top electrical contact 401, a MTJ 402, a conductive magnetic layer 404 (which can be made of a ferromagnetic material or a ferrimagnetic material), and a nonmagnetic spacer layer 406. MTJ 402 further includes a pinned magnetic layer 408 and a free magnetic layer 410, and a tunnel barrier layer 412 sandwiched between and in contact with both the pinned and free magnetic layers. In device structure 400, pinned magnetic layer 408 has an in-plane magnetization pointing to the right (but can also point to the left in other embodiments). Free magnetic layer 410 also has an in-plane magnetization. However, the in-plane magnetization is configured as two opposing magnetic domains of opposing magnetizations and a domain wall 424 formed between the two magnetic domains. To maintain the stability of the two opposing in-plane magnetizations, free magnetic layer 410 is configured with high in-plain magnetic anisotropy, for example, by using a large dimension in the direction of the magnetization (as shown in FIG. 4A). In some embodiments, free magnetic layer 410 are implemented with magnetic wires.

FIG. 4A shows the domain wall location to be substantially in the middle of free magnetic layer 410 directly under the tunneling junction. In this scenario, the magnetizations of the two opposing magnetic domains substantially cancel out each other. However, a charge current in conductive magnetic layer 404 can be used to move the domain wall location either all the way to the left or all the way to the right to implement a controlled switching. For example, when a charge current 416 flows in the direction shown in FIG. 4A, the generated spin-transfer torque will move domain wall 424 all the way to the right in free magnetic layer 410, thereby creating a net magnetization which is parallel to the magnetization of the pinned magnetic layer 408. In this scenario, the MTJ 402 can be in a low resistance state. Next, when charge current 416 flows in the opposite direction to the one shown in FIG. 4A, the direction of the generated spin-transfer torque is reversed, and the spin-transfer torque will move domain wall 424 all the way to the left in free magnetic layer 410, thereby creating a net magnetization which is antiparallel to the magnetization of the pinned magnetic layer 408. In this scenario, the MTJ 402 can be in a high resistance state. Hence, the domain wall can be controllably and efficiently moved back and forth in two stable states. Because the charge current is not used to switch the magnetization in each domain, the amplitude of the charge current may be smaller than when those used to switch the magnetization in the free magnetic layer 410.

Figure 4B:
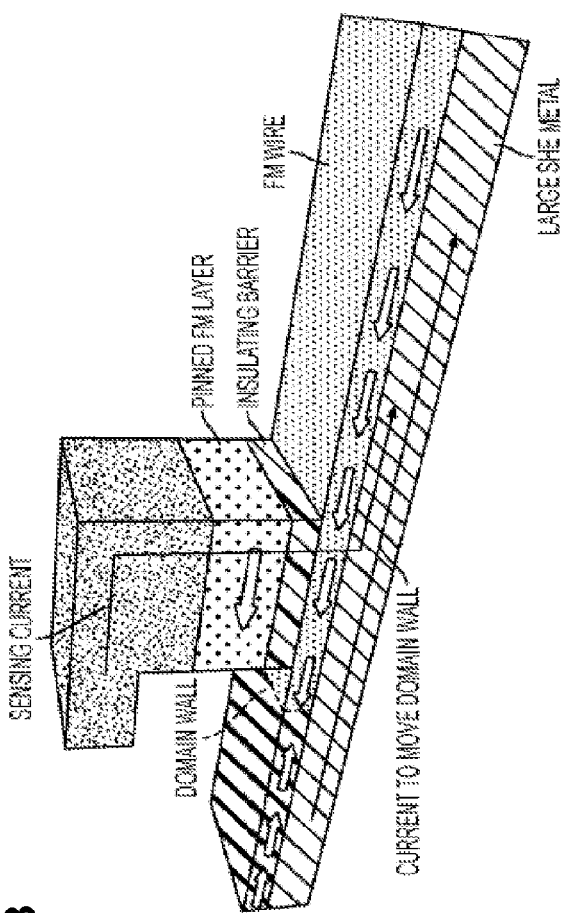
Figure 4C:
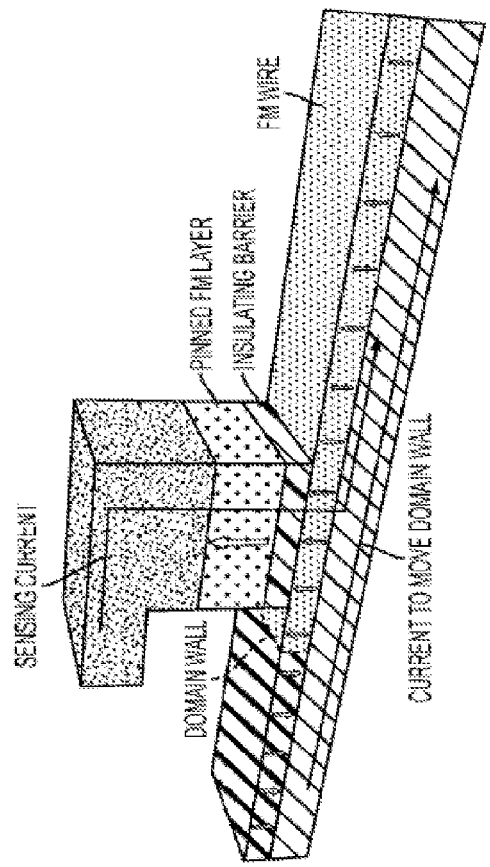

In some implementations, the free layer with different domains can be configured as a long wire or wire segment in which information is stored via the positions of magnetic domain walls which separate domains with different magnetization directions. The torque from the SHE-generated spin-polarized current can be used to enhance the ability of an electrical current to manipulate the positions of magnetic domain walls by using samples in which the magnetic free layer wire is in contact with a non-magnetic thin film that exhibits a strong SHE, in combination with a pinned magnetic layer to read out the magnetic orientation of the free layer, as illustrated in FIG. 4B and FIG. 4C. The current may flow laterally parallel to the sample plane or a lateral current may be applied in combination with a vertical current. The torque from the SHE may directly assist in moving the domain wall and it may also stabilize the configuration of the domain wall enabling it to be moved at greater velocity and improved efficiency compared to the influence of the conventional spin transfer torque effect alone.

Similarly to the device structures 200 and 300, the generated spin-transfer torque by the anomalous Hall effect can have both an in-plane component and a perpendicular component, wherein the relative strength of the two components depends on the angle of the magnetic moment of conductive magnetic layer 404. The perpendicular component of the generated spin-transfer torque may have a dominate role in enabling efficient manipulation of transverse domain walls such as domain wall 424. In some embodiments, the switching time between the two described states in device structure 400 is governed by the domain wall velocity, wherein an exemplary domain wall velocity is a few hundred m/s. In some embodiments, the current used for the domain manipulation can be less than 100 µA.

Figure 5:
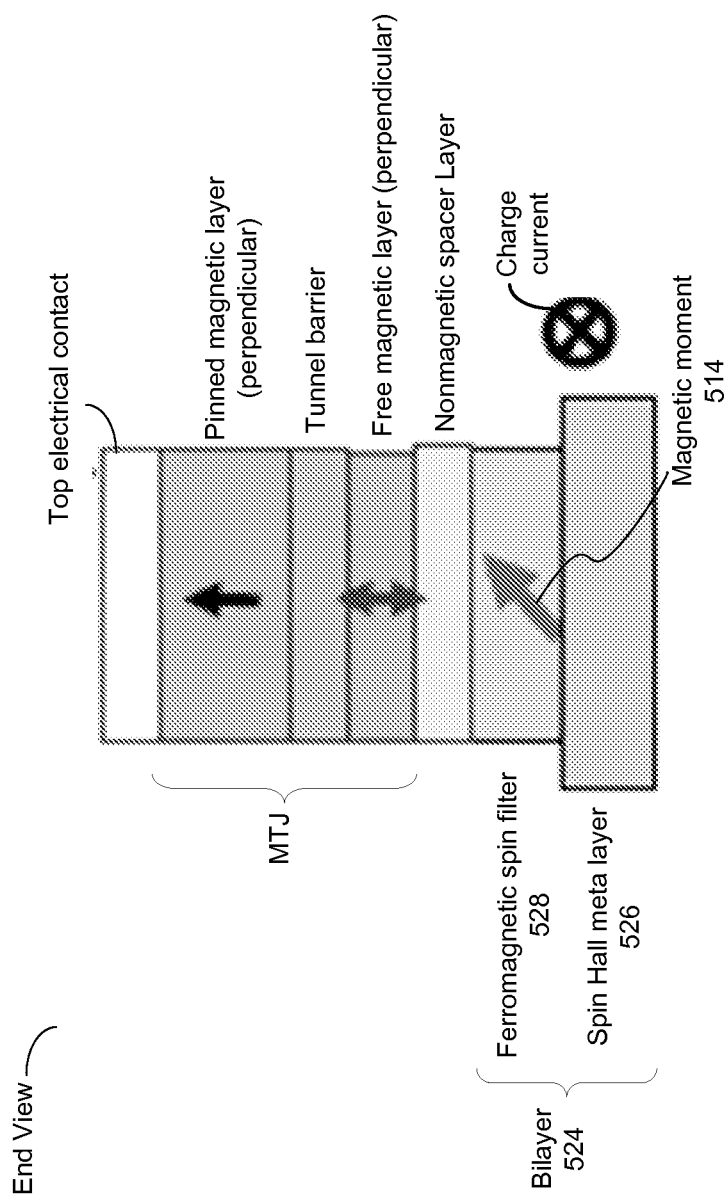
FIG. 5 illustrates an alternative device structure to the device structure in FIG. 2 to generate anti-damping switching of a magnetic free layer with perpendicular magnetic anisotropy using perpendicular spin torque from the spin Hall effect.
Figure 6:
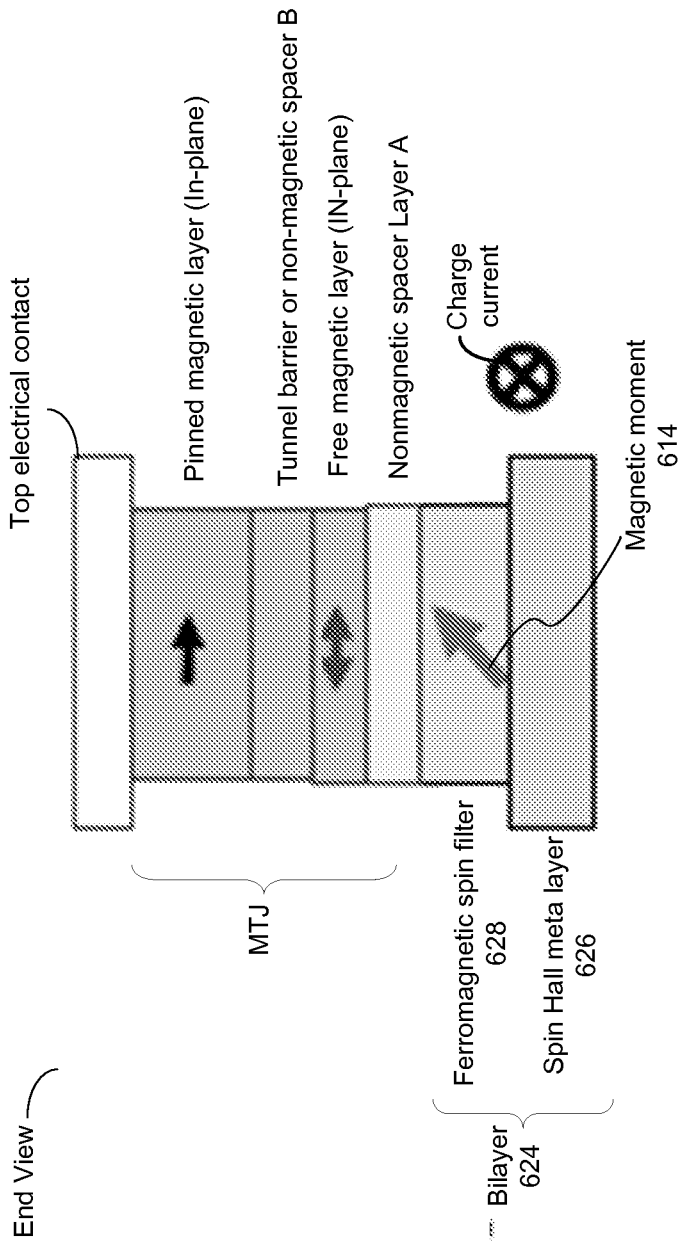
FIG. 6 illustrates an alternative device structure to the device structure in FIG. 3 to generate precessional switching of an in-plane magnetic free layer using perpendicular spin torque from the spin Hall effect.
Figure 7:
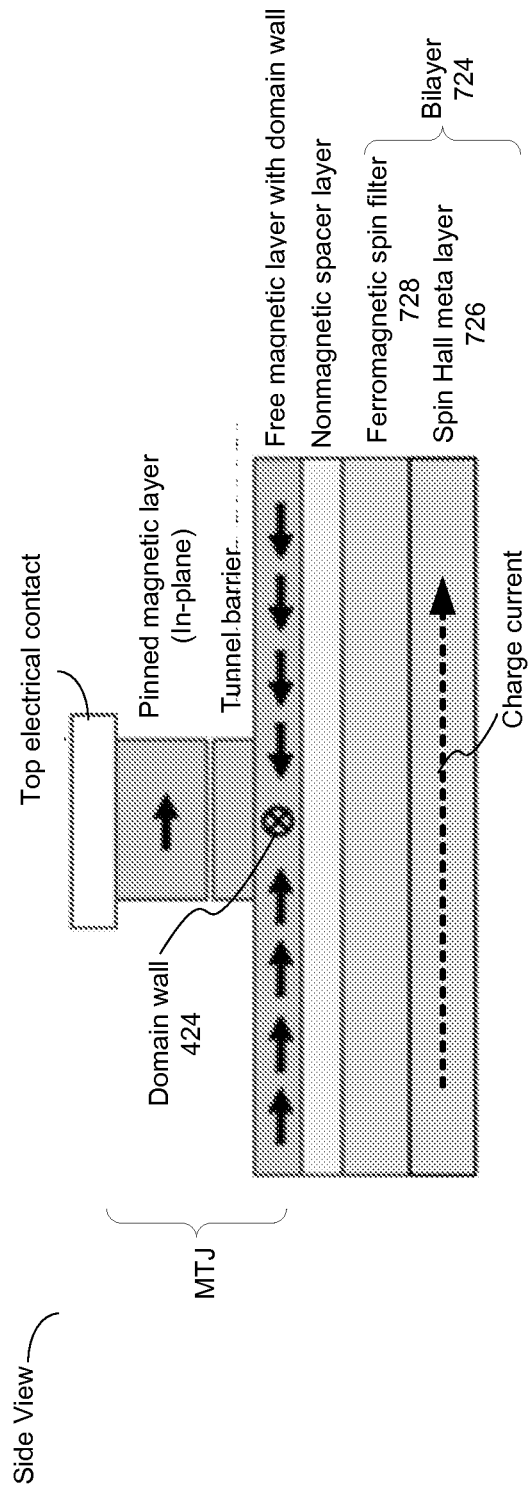
FIG. 7 illustrates an alternative device structure to the device structure in FIG. 4 to manipulate a magnetic domain wall within the in-plane magnetic free layer using at least the perpendicular spin torque from the spin Hall effect.

Embodiments of FIGS. 2-4 are based on the anomalous Hall effect, which uses the same material/layer to provide both the spin Hall effect and the ferromagnetism or the ferrimagnetism. However, the achievement of an out-of-plane component of spin-transfer torque by the combination of the spin Hall effect with ferromagnetism/ferrimagnetism does not necessarily need to be realized by using the same material/layer to provide both the spin Hall effect and the ferromagnetism. Embodiments of FIGS. 5-7 are various examples of using a metal/magnet bilayer structure in place of the single layer conductive magnetic layers 204-404 in FIGS. 2-4, respectively. In each of these embodiments, a spin-Hall metal layer of the metal/magnet bilayer structure, such as one made of a heavy-metal material is used to generate a spin-polarized current. The ferromagnetic/ferrimagnetic layer of the metal/magnet bilayer structure operates as a spin filter, absorbing the component of SHE-generated spin-polarized current perpendicular to the moment of the ferromagnetic/ferrimagnetic layer and transmitting the component of the spin-polarized current parallel or antiparallel to the magnetization (assuming the ferromagnetic/ferrimagnetic layer is thinner than the associated spin diffusion length). This transmitted component of the spin-polarized current can be used to apply spin-transfer torque to a nearby free magnetic layer for magnetization switching or domain wall manipulation.

By optimizing material properties to enable strong spin-orbit coupling, a bilayer metal/magnet structure may be made more efficient than the spin torque generated by the anomalous Hall effect in a single-layer configuration in one or more of the embodiments described in FIGS. 2-4. For example, FIG. 5 illustrates an alternative device structure 500 to device structure 200 in FIG. 2 to generate anti-damping switching of a magnetic free layer with perpendicular magnetic anisotropy using perpendicular spin torque from the spin Hall effect. More specifically, FIG. 5 provides the end view of the device structure 500. Compared to the end view of the device structure 200, we note that a bilayer structure 524 comprising a spin Hall metal layer 526 and a ferromagnetic spin filter 528 replaces the single conductive magnetic layer 204, while other layers are substantially the same as the device structure 200. Ferromagnetic spin filter 528 also has a magnetic moment 514 having an out of plane orientation as shown by the red arrow.

FIG. 6 illustrates an alternative device structure 600 to device structure 300 in FIG. 3 to generate precessional switching of an in-plane magnetic free layer using perpendicular spin torque from the spin Hall effect. More specifically, FIG. 6 provides the end view of the device structure 600. Compared to the end view of the device structure 300, we note that a bilayer structure 624 comprising a spin Hall metal layer 626 and a ferromagnetic spin filter 628 replaces the single conductive magnetic layer 304, while other layers are substantially the same as the device structure 300. Ferromagnetic spin filter 628 also has a magnetic moment 614 having an out of plane orientation as shown by the red arrow.

FIG. 7 illustrates an alternative device structure 700 to device structure 400 in FIG. 4 to manipulate a magnetic domain wall within the in-plane magnetic free layer using at least the perpendicular spin torque from the spin Hall effect. More specifically, FIG. 7 provides the side view of the device structure 700. Compared to the side view of the device structure 400, we note that a bilayer structure 724 comprising a spin Hall metal layer 726 and a ferromagnetic spin filter 728 replaces the single conductive magnetic layer 404, while other layers are substantially the same as the device structure 400.

In the bilayer structure designs such as from FIGS. 5-7, it may also be possible to enhance the perpendicular spin-polarized current by manipulating interface anisotropies so that the magnetic moment in the ferromagnetic spin filter is spatially non-uniform, oriented in-plane at the interface with the spin Hall metal layer and rotating out-of-plane at the interface facing toward the free magnetic layer.

The following sections provide further details for implementing the 3-terminal circuit design based on the above SHE-based MTJ device structure 100 in FIG. 1A which is configured to render the spin polarization of the injected charged particles or electrons at an angle with respect to the magnetic layers of the MTJ 102. Some aspects of 3-terminal circuits having MTJs are disclosed in Applicant's prior patent applications in Cornell Unversity's PCT Application No. PCT/US2012/051351 entitled "SPIN HALL EFFECT MAGNETIC APPARATUS, METHOD AND APPLICATIONS" which is published under PCT Publication No. WO 2013/025994 A2, and PCT Application No. PCT/US2013/053874 entitled "ELECTRICALLY GATED THREE-TERMINAL CIRCUITS AND DEVICES BASED ON SPIN HALL TORQUE EFFECTS IN MAGNETIC NANO-STRUCTURES" which is published under PCT Publication No. WO 2014/025838 A1. Both PCT applications are incorporated by reference as part of the disclosure of this patent document.

Notably, as specific examples for using the SHE structure in 3-terminal device configurations, the perpendicular spin-polarized current can be combined with voltage controlled magnetic anisotropy generated by a voltage signal applied to the top contact, such as top contact layers 201-701 to further improve the efficiency of spin torque manipulation of magnetic memory devices in any of the device geometries depicted in FIGS. 2-7.

Figure 8A:
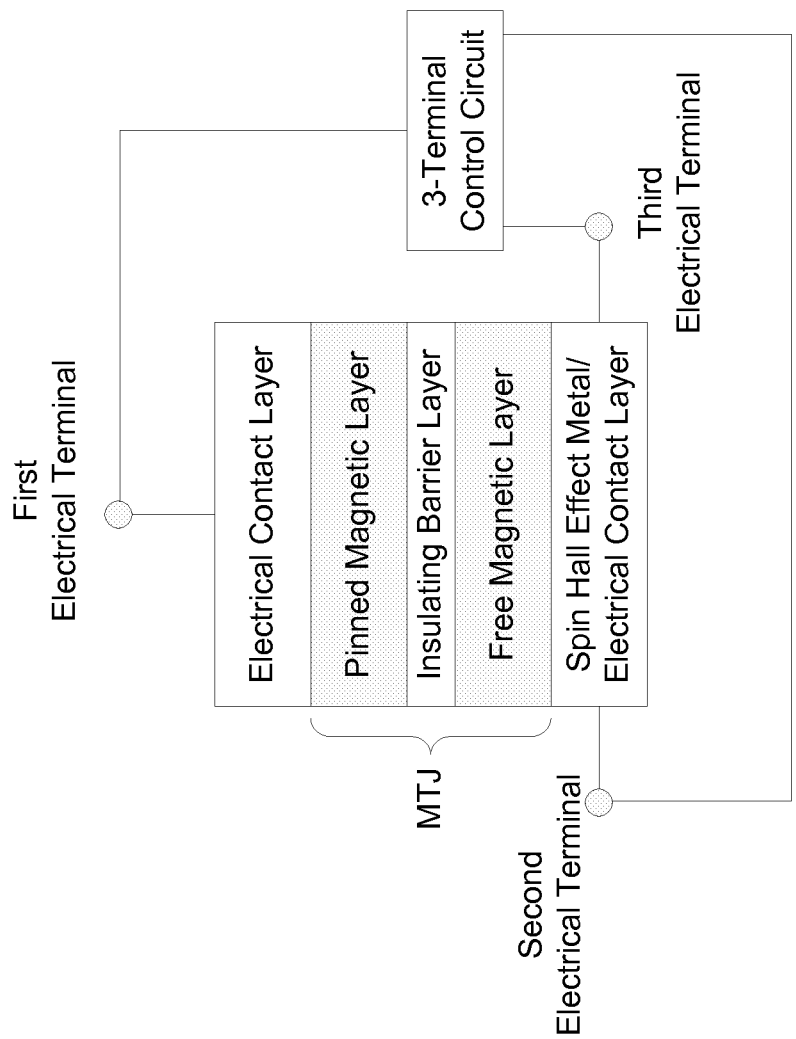
FIGS. 8A and 8B show examples of magnetic tunnel junction (MTJ) circuits in a 3-terminal circuit configuration implementing a spin Hall effect metal layer for providing a spin-polarized current into the free magnetization layer of the MTJ.

FIG. 8A shows an example of a 3-terminal MTJ device having a spin Hall effect (SHE) metal layer coupled to the free magnetic layer of the MTJ junction. The layers in the MTJ and the SHE metal layer, e.g., selection of the materials and dimensions, are configured to provide a desired interfacial electronic coupling between the free magnetic layer and the SHE metal layer to generate a large flow of spin-polarized electrons or charged particles in the SHE metal layer under a given charge current injected into the SHE metal layer and to provide efficient injection of the generated spin-polarized electrons or charged particles into the free magnetic layer of the MTJ. Each of the free magnetic layer or the pinned magnetic layer can be a single layer of a suitable magnetic material or a composite layer with two or more layers of different materials. The free magnetic layer and the pinned magnetic layer can be electrically conducting while the barrier layer between them is electrically insulating and sufficiently thin to allow for electrons to pass through via tunneling. The spin Hall effect metal layer can be adjacent to the free magnetic layer or in direct contact with the free magnetic layer to allow the spin-polarized current generated via a spin Hall effect under the charge current to enter the free magnetic layer.

The 3 terminals in the MTJ device in FIG. 8A can be used to implement two independent control mechanisms that are not possible in a 2-terminal MTJ device. As illustrated, the first control mechanism is via applying a gate voltage across the MTJ junction with the first terminal so that the electric field at the free magnetic layer caused by the applied gate voltage can modify the magnetic anisotropy of the free magnetic layer including its perpendicular magnetic anisotropy that affects the threshold value of a spin-polarized current that can switch the magnetization of the free magnetic layer via spin torque transfer from a spin-polarized current that is injected into the free magnetic layer. The second, independent control mechanism uses second and third electrical terminals at two contact locations of the SHE metal layer on two opposite sides of the area in contact with the MTJ of the SHE metal layer to supply the charge current in the SHE metal layer to produce the spin-polarized electrons or charged particles based on the spin Hall effect.

In principle, the layers of the MTJ and the SHE metal layer can be configured to allow either one of the gate voltage across the MTJ or the charge current in the SHE metal layer to independently cause switching of the magnetization of the free magnetic layer. However, in the disclosed 3-terminal MTJ devices in this document, the gate voltage across the MTJ is controlled to be less than the threshold voltage that is sufficient to independently cause a significant current tunneling through the barrier layer of the MTJ to trigger the switching, and similarly, the charge current in the SHE metal layer is controlled to be less than the threshold charge current that is sufficient to independently cause a significant amount of the spin-polarized charges to enter the free layer to trigger the switching. Notably, the disclosed 3-terminal MTJ devices and techniques can be designed to use the combined operation of both the gate voltage across the MTJ and the charge current in the SHE metal layer to collectively trigger the switching in the free magnetic layer. In FIG. 8A, a 3-terminal control circuit is coupled to the first, second and third electrical terminals to achieve the above desired control operations.

Specifically, the 3-terminal control circuit is operated as the following. The gate voltage is applied between a first electrical terminal in contact with the pinned magnetic layer and the spin Hall effect metal layer to modify the perpendicular magnetic anisotropy of the free magnetic layer, without allowing the gate voltage alone to cause switching of the magnetization direction of the free magnetic layer; and the charge current is applied between two electrical terminals in the spin Hall effect metal layer to induce a spin-polarized current into the free magnetic layer without switching of the magnetization of the free magnetic layer. The application of the gate voltage and the application of the charge current are synchronized in order to switch the magnetization of the free magnetic layer.

Figure 8B:
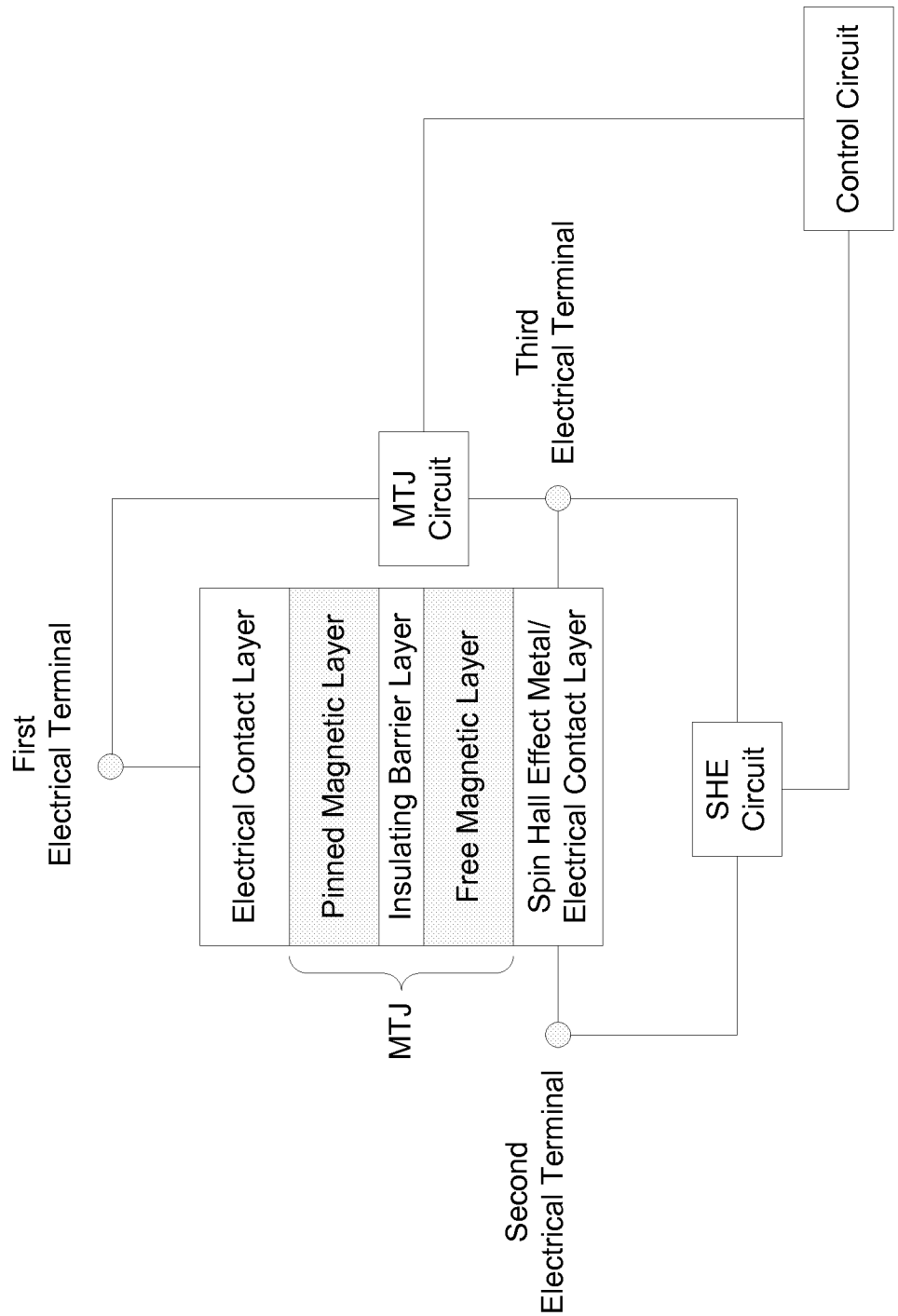

FIG. 8B shows an example where the 3-terminal control circuit in FIG. 8A is implemented by a MTJ circuit and a SHE circuit. The MTJ circuit is coupled between the first and the third terminals to apply a desired voltage across the MTJ without switching the magnetization of the free magnetic layer. The SHE circuit is coupled between the second and the third electrical terminals to supply the charge current in the SHE metal layer. A control circuit is further coupled to the MTJ circuit and the SHE circuit to control the operations of the MTJ and the SHE circuits, e.g., controlling the voltage amplitude or direction across the MTJ, the current amplitude or direction of the charge current in the SHE metal layer, and synchronizing the voltage and the charge current in time for switching the magnetization of the free magnetic layer.

The 3-terminal MTJ devices disclosed in FIGS. 8A, 8B and other parts of this document can be implemented to provide circuit configurations and operational features that are difficult to achieve in 2-terminal MTJ devices and to achieve certain advantages in applications. For example, the charge current applied to the spin Hall effect metal layer via two electrical terminals at two contact locations of the spin Hall effect metal layer is used to inject a spin-polarized current into the free magnetic layer of the MTJ for effectuating a spin torque transfer into the free magnetic layer eliminates the need to apply a large current across the MTJ for effectuating sufficient spin torque transfer into the free magnetic layer for switching the magnetization of the free magnetic layer as in the 2-terminal MTJ device. This can be advantageous because there are detrimental aspects to effecting the magnetic reorientation of the free magnetic layer (FL) with a current pulse that passes through the tunnel barrier layer for the memory cell application. For example, the high current pulse required to tunnel through the MTJ junction for the switching operation can result in degradation of the electrical integrity of the insulator barrier layer in the MTJ. In a 2-terminal MTJ device, the design of the FL can be made to reduce the required write current pulse amplitude for the switching operation. However, since the reading operation and the writing operation in this 2-terminal MTJ device are effectuated via the same two terminals of the MTJ, the electrical bias required to provide a large enough signal for a fast read of the memory cell can produce a tunneling current through the MTJ that is lower but close to the designed threshold current for the switching operation of the MTJ. This condition can result in a "write-upon-read" error where the MTJ is inadvertently switched during a read operation due to electrical noise that momentarily adds a small amount of additional current to the read current. The rate of this "write-upon-read" error increases as the difference between the current tunneling through the MTJ during a read operation and the STT threshold current for switching the MTJ becomes smaller. As such, various 2-terminal MTJ devices face a conflict between the need to reduce the amplitude of the tunneling current for switching the MTJ and the need for fast read associated with using a sufficiently large read current to complete the measurement of the MTJ resistance for reading the stored bit in a short time. Different from the 2-terminal MTJ devices, the 3-terminal MTJ devices in this document are configured to provide two separate and independent controls over the voltage across the MTJ to eliminate the above dilemma in the 2-terminal MTJ devices and can achieve a low tunneling current across the MTJ during a write operation while still being able to achieve a fast reading operation without being subject to the "write-upon-read" error in the 2-terminal MTJ devices. To effectuate a switching in the 3-terminal MTJ devices disclosed in this document, the two separate controls are synchronized in order to switch the magnetization of the free magnetic layer.

For a large array of 3-terminal MTJ cells in various circuits, the column and row driving circuits for the array of 3-terminal MTJ cells can be designed to reduce the overall circuit size by sharing circuit elements. As described in greater detail in the examples below, a cross-point memory architecture can be implemented based on the gated spin Hall torque switching to provide sharing of transistor switches in the 3-terminal MTJ cells, thus improving the overall compactness of circuits using large arrays of 3-terminal MTJ cells.

In another aspect, the availability of three terminals as input/output ports for a 3-terminal MTJ device disclosed in this document can be used to implement various logic operations. In contrast, with only two terminals available, the 2-terminal MTJ devices tend to be difficult, or infeasible in some cases, in building circuits for various binary logic applications based on the spin-torque switching operations.

In yet another aspect, the 3-terminal MTJs in combination with spin transfer torque disclosed in this document can be configured to employ a magnetic configuration such that the free magnetic layer has only one stable magnetic state but can be excited into magnetic precession about this equilibrium state at microwave or RF frequencies by the anti-damping torque generated by a steady spin-polarized direct current that impinges on the free magnetic layer. The frequency of oscillation is determined by the total time-averaged effective magnetic field experienced by the free magnetic layer, and this can vary with the amplitude of the magnetic precession, which in turn depends on the amplitude of the bias current. The time varying magnetoresistance of the MTJ due to the precession of the free magnetic layer provides a microwave output signal. Thus spin transfer torque can be employed in a MTJ to produce a spin-torque nano-oscillator (STNO) that has potential application in on-chip communication and signal processing applications. In STNO devices based on 2-terminal MTJ devices, the amplitude of the oscillator cannot be electrically varied independently of its frequency, due to the 2-terminal character of the MJT.

Specific implementations and examples of the present 3-terminal MTJ devices and applications are provided below.

Figure 9A:
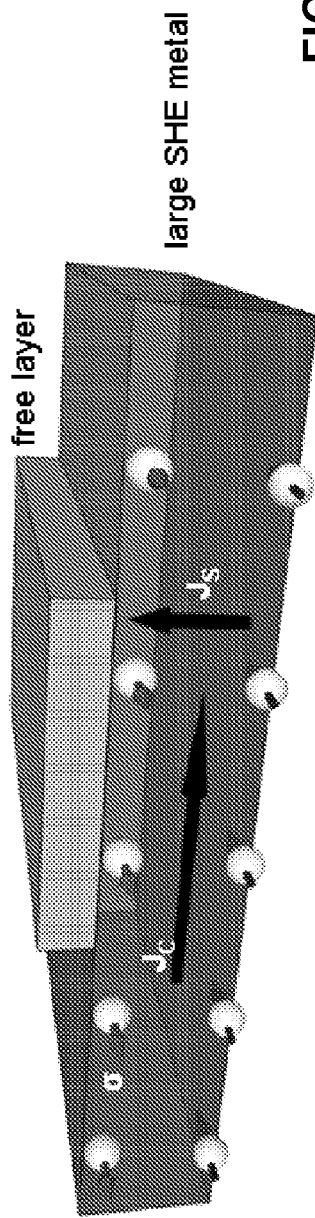
FIGS. 9A and 9B illustrate operation of a spin Hall effect metal layer for providing a spin-polarized current into the free magnetization layer, wherein the flowing directions of the in-plane charge current $J_c$ (or $J_e$) and out-of-plane spin-polarized current $J_s$ and the direction of the injected spin $6$ are shown.
Figure 9B:
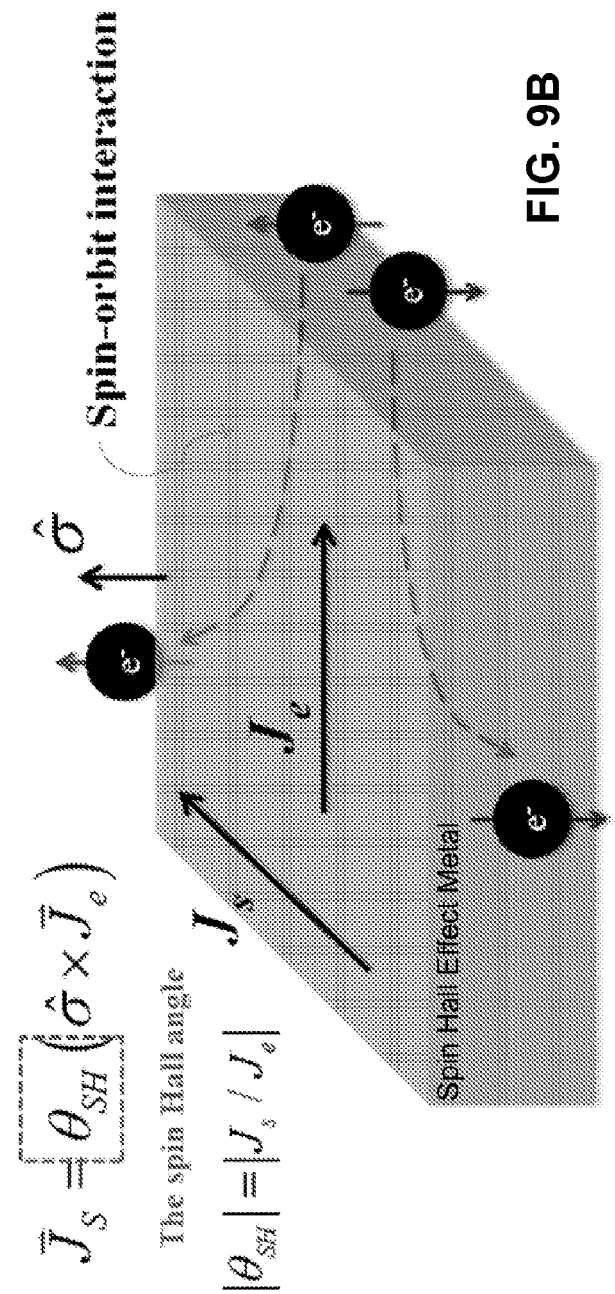

The giant spin Hall effect in various heavy (high atomic number) metals, such as Pt, Ta, W, Hf, and others, provides the foundation for the new 3-terminal MTJ devices in this document. The spin Hall effect in certain metals with large atomic numbers is illustrated in FIGS. 9A and 9B. FIG. 9A shows a spin Hall effect metal layer is in direct contact with a free magnetic layer of an MTJ for receiving an in-plane charge current $J_c$ (or $J_e$) and for producing a spin-polarized current $J_s$ into the free magnetization layer. The flowing directions of the in-plane charge current $J_c$ (or $J_e$) and out-of-plane spin-polarized current $J_s$ and the direction of the injected spin σ are shown. FIG. 9B further illustrates that the spin Hall effect separates two spin states in the charge current in opposite directions that are perpendicular to the in-plane charge current $J_c$ (or $J_e$). Hence, by controlling the current direction of the in-plane charge current $J_c$ (or $J_e$) in the SHE metal layer, one of the two spin states can be selected as the spin-polarized current $J_s$ that is injected into the free magnetization layer.

FIG. 9B further shows that, the orientation of the injected spins in the spin-polarized current J is determined by a relationship between the charge current $J_c$ (or $J_e$), the direction of the injected spin moments $\vec{\sigma}$ (not the angular momenta) and the charge current $J_c$: $\vec{J} \propto \theta_{SH} \vec{\sigma} \times \vec{J}_c$, where $\theta_{SH}$ is the spin Hall angle and is a parameter specific to each material and quantifies the magnitude of the SHE effect in each material.

In FIGS. 9A and 9B and some subsequent figures, only the in-plane spin polarization component of the injected spins in the spin-polarized current J is illustrated but it is understood that there is an out-of-plane spin polarization component as shown in FIG. 1B.

In the spin Hall effect, an electrical current flowing through a heavy metal thin film layer creates a transverse spin current due to spin dependent deflection of electrons in the directions perpendicular to the direction of current flow. Electrons of opposite spin angular momentum are deflected in opposite directions as illustrated in FIGS. 9A and 9B. In layers of high resistivity beta-Ta, for example, the spin Hall effect is particularly strong with the transverse spin current density being as high as 0.15 of the longitudinal electrical current density. This spin current can be utilized to exert torque on the magnetization of an adjacent magnetic film, and thus enables a 3-terminal magnetic circuit or device for reversing the magnetic orientation of the FL of a magnetic tunnel junction that is formed on top of a spin Hall layer, as also illustrated in FIGS. 8A and 8B.

Figure 10:
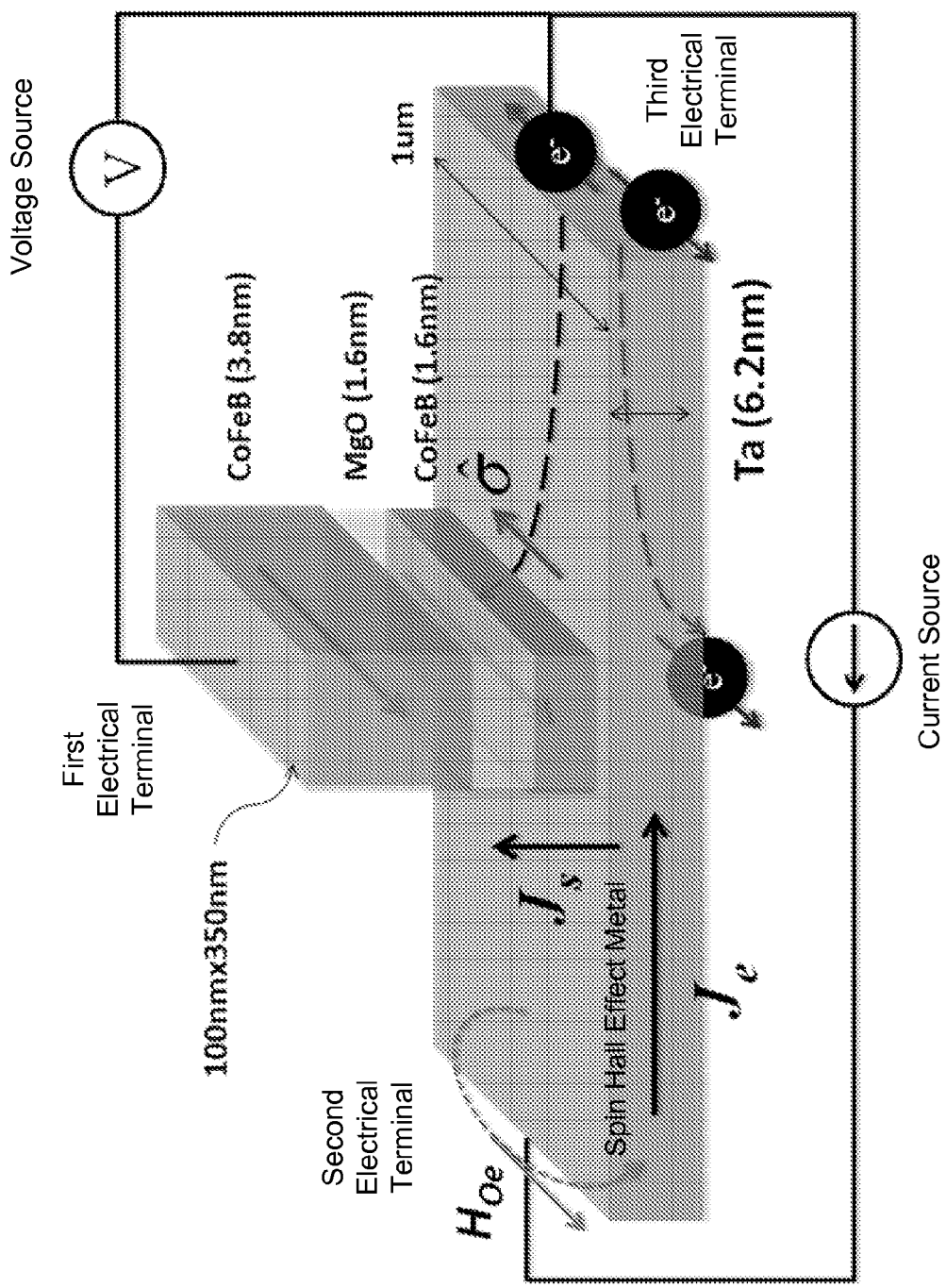
FIG. 10 shows an example of a 3-terminal MTJ circuit having a current source coupled to the spin Hall effect metal layer and a voltage source coupled across the MTJ.

FIG. 10 shows an example of a 3-terminal MTJ circuit that includes a voltage source coupled between the first and third electrical terminals across the MTJ and a current source coupled between the second and third electrical terminals to the spin Hall effect metal layer. The FL and PL layers in this example are shown to be parallel to the planes of the layers as in-plane magnetization that is perpendicular to the direction of the in-plane charge current $J_c$ (or $J_e$) in the SHE metal layer.

The present 3-terminal MTJ devices operate to effectuate switching of the magnetization in the free magnetic layer by simultaneously applying the gate voltage across the MTJ junction and the charge current in the SHE metal layer. This aspect of the 3-terminal MTJ devices is based on voltage-controlled magnetic anisotropy (VCMA), in which an electric field alters a ferromagnetic film's perpendicular anisotropy by changing the electronic structure at a ferromagnet/oxide interface. VCMA has been shown to enable strong tuning of the coercive magnetic field of the FL in a MTJ and direct toggle switching of the FL by voltage pulses applied across the MTJ. A significant aspect of VCMA is that it offers the potential of effecting the switching of a FL with little or no current flow through the MTJ, which could lower the energy cost of the MRAM write operation by minimizing Ohmic loss.

Considering the example in FIG. 10, the in-plane charge current $J_e$ in the SHE metal layer is set to produce the spin-polarized $J_s$ that is perpendicular to the in-plane charge current $J_e$ in the SHE metal layer. When the SHE metal layer is sufficiently thin in the transverse direction, the spin-polarized $J_s$ is injected into the free magnetization layer without significantly losing the injected spin moments $\vec{\sigma}$ due to the spin relaxation caused by propagation of the electrons or charged particles. The magnitude of the in-plane charge current $J_e$ in the SHE metal layer is controlled to be sufficiently small so that the spin-polarized current $J_s$ that has entered the free magnetization layer is significantly smaller than the threshold current for the spin-polarized current to cause switching of the magnetization of the free magnetic layer. The gate voltage across the MTJ junction, however, is applied to alter the perpendicular anisotropy by changing the electronic structure at the ferromagnet/oxide interface due to the voltage-controlled magnetic anisotropy (VCMA) to lower the threshold current required for the spin-polarized current to cause switching of the magnetization of the free magnetic layer to a level that the spin-polarized current $J_s$ that has entered the free magnetization layer is at or above the newly reduced threshold current for switching the MTJ. Under this condition of simultaneous application of the charge current and the gate voltage, the magnetization of the free magnetic layer is switched.

Figure 11A:
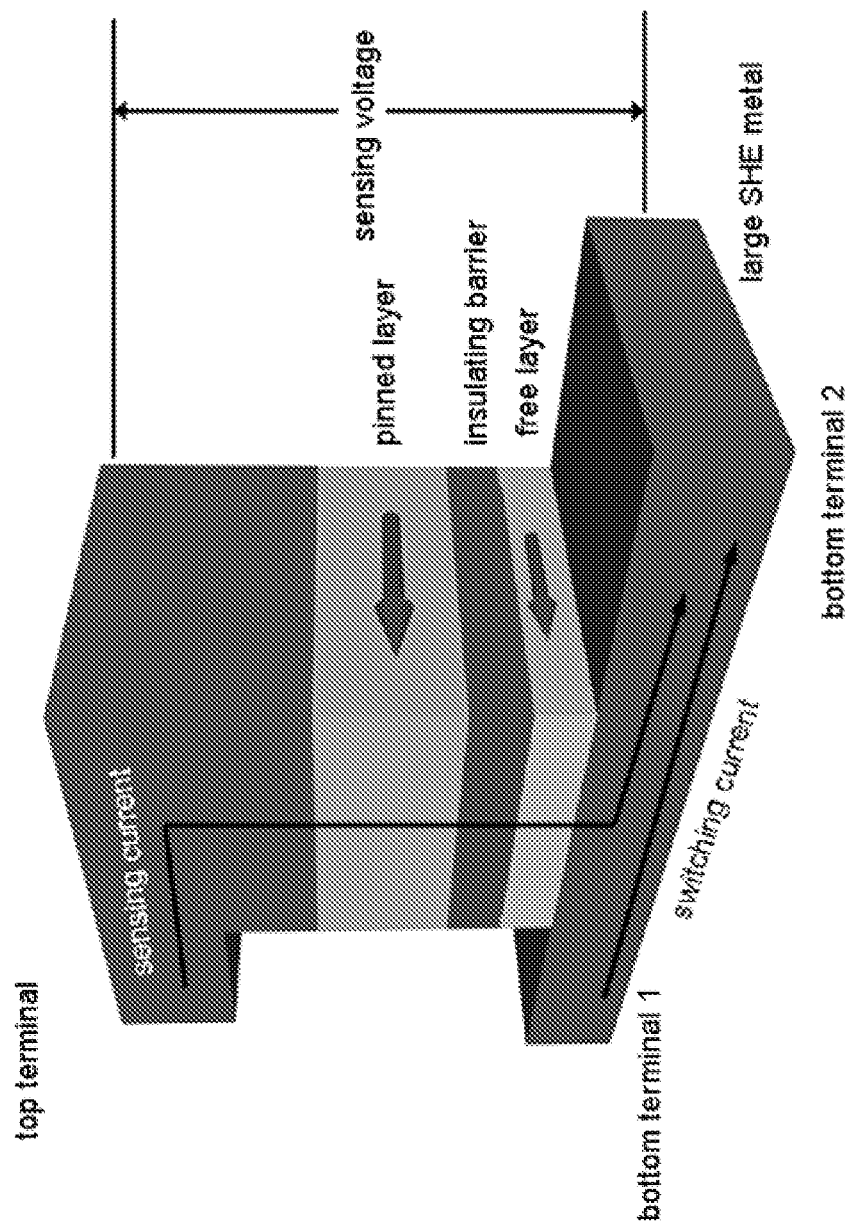
FIG. 11A shows an example of a schematic perspective-view diagram illustrating a three terminal ST-MRAM device cell that employs the spin Hall effect (SHE) and a gate voltage across the MTJ for a writing operation where the ST-MRAM cell is comprised of a magnetic tunnel junction having in-plane magnetic layers and a SHE conductive strip located on the bottom of the STT-MRAM device structure.
Figure 11B:
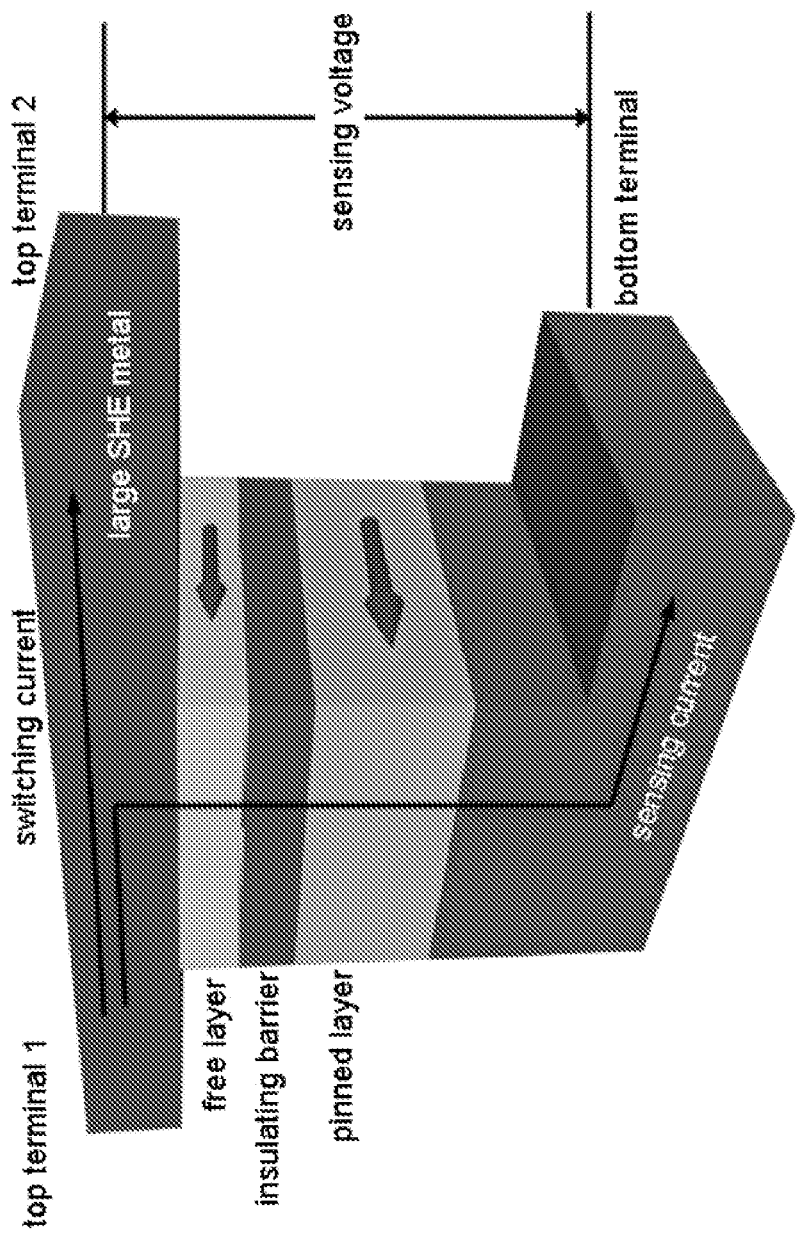
FIG. 11B shows another example of a three terminal ST-MRAM device cell that employs the spin Hall effect (SHE) and a gate voltage across the MTJ for a writing operation, where the magnetic tunnel junction has in-plane magnetic layers and the SHE conductive strip is located on the top of the STT-MRAM device structure.

FIG. 11A shows an example of a schematic perspective-view diagram illustrating a three terminal ST-MRAM device cell that employs the spin Hall effect (SHE) and a gate voltage across the MTJ for a writing operation where the ST-MRAM cell is comprised of a magnetic tunnel junction having in-plane magnetic layers and a non-magnetic strip with a strong SHE and the non-magnetic strip is located on the bottom of the STT-MRAM device structure. FIG. 11B shows another example of a three terminal ST-MRAM device cell that employs the spin Hall effect (SHE) and a gate voltage across the MTJ for a writing operation, where the magnetic tunnel junction has in-plane magnetic layers and the non-magnetic strip with the strong SHE is located on the top of the STT-MRAM device structure.

The SHE and VCMA can also be combined to yield gate controlled SHE switching of the FL in a MTJ in the case where the magnetic moments $\overline{m}_1$ and $\overline{m}_2$ of the free layer and reference layer of the MTJ are oriented perpendicular to the plane of the films. In this configuration, the in-plane components of injected spins from the SHE $\vec{\sigma}$ are still along +/−x-axis in the plane of MTJ layers while the equilibrium position for $\overline{m}_1$ is aligned along the +/−z axis perpendicular to the MTJ layers. So, the direction of $\overline{m}_1$ and that of $\vec{\sigma}$ are perpendicular to each other. In this situation the effect of the spin torque from the spin current generated by the SHE can be described using an effective magnetic field $H_{ST}$.

Figure 12A:
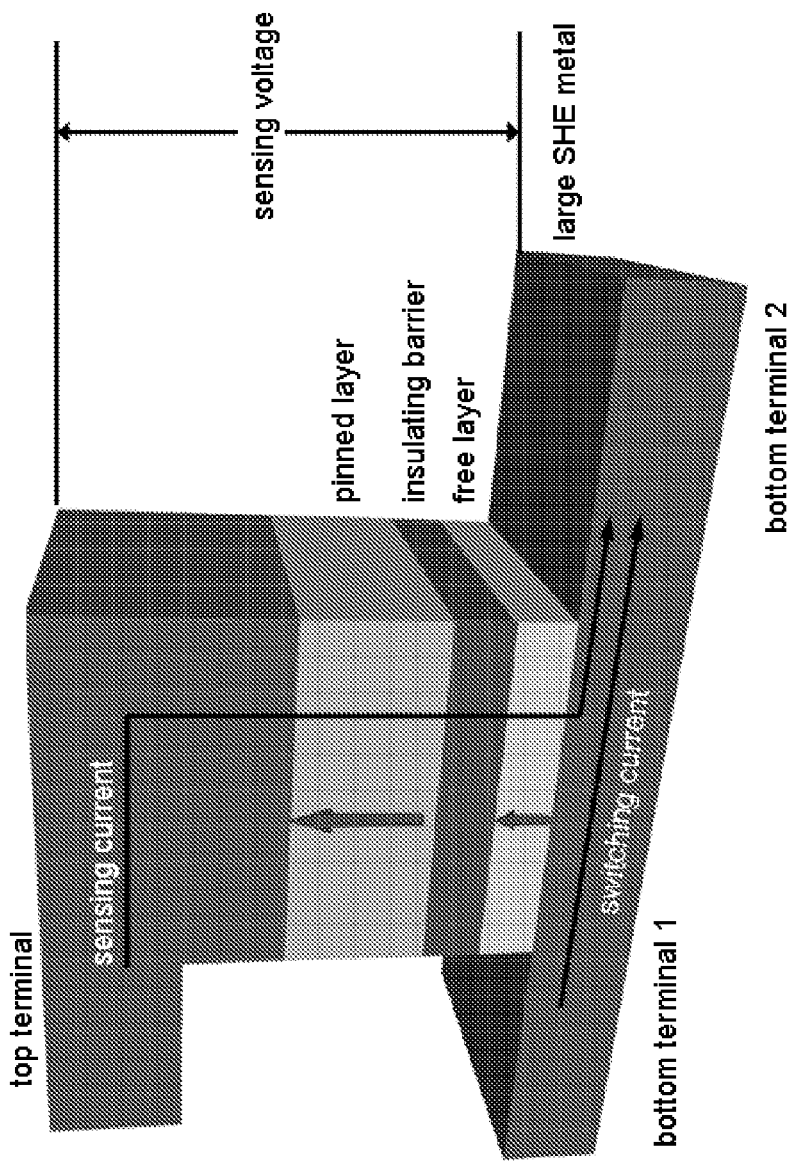
FIG. 12A shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane.

FIG. 12A shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane.

Figure 12B:
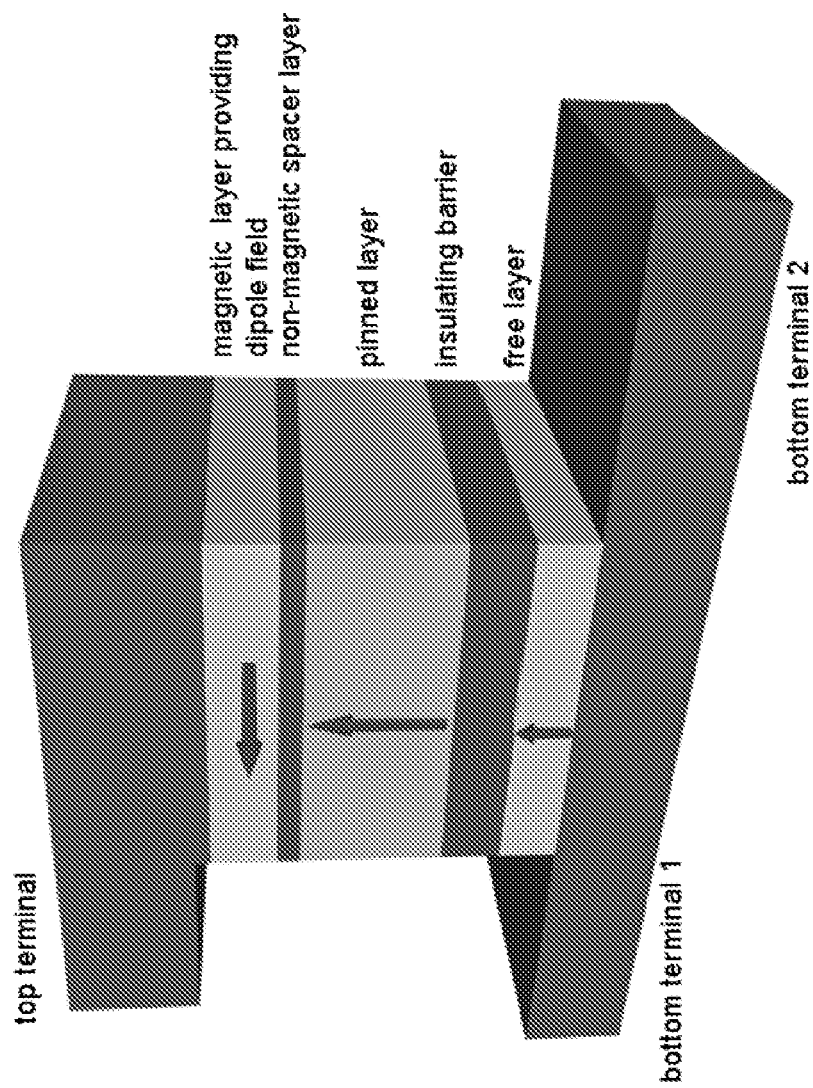
FIG. 12B shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane, and an additional in-plane magnetized ferromagnetic material layer is provided in the MTJ stack to produce an in-plane magnetic bias field for defining a definite switching direction for the perpendicular magnetization of the free magnetic layer. This in-plane magnetized ferromagnetic material layer in the MTJ stack (e.g., between the first electrical terminal and the spin Hall effect metal layer as shown) eliminates a separate magnetic mechanism to produce the magnetic bias field at the free magnetic layer. A non-magnetic spacer layer can be provided to be in contact with the pinned magnetic layer, and the magnetic layer is in contact with the non-magnetic spacer layer and configured to have a magnetization direction in the magnetic layer to produce the bias magnetic field in the free magnetic layer.

FIG. 12B shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane, and an additional in-plane magnetized ferromagnetic material layer is provided in the MTJ stack to produce an in-plane magnetic bias field for defining a definite switching direction for the perpendicular magnetization of the free magnetic layer.

The above design in FIG. 12B is explained below. the 3-terminal SHE switching results demonstrate that a spin Hall effect can be very effective in switching the free layer of a magnetic tunnel junction without any substantial part of the switching current required to flow through the MTJ, which solves a major reliability issue associated with conventional 2-terminal ST-MRAM devices. Moreover, the current required for switching the FL from being parallel (P) to being antiparallel (AP) to the PL is essentially the same as is required for switching in the opposite direction, AP to P, and of course the electrical impedance for the write operation is the same for both switching directions. This feature is in sharp contrast to the case of the 2-terminal MTJ spin torque device where the switching currents are quite different for the two switching directions, and the electrical impedance at the beginning of the write operation is also quite different for the two switching directions. These symmetric characteristics of the write operation in a 3-terminal SHE switched MTJ memory cell provide advantages for the design of magnetic memory circuits.

When achieving the SHE induced switching with $\vec{m}_1$ and $\vec{m}_2$ oriented perpendicular to the substrate plane as in FIG. 12B, the in-plane spin polarization components of injected spins from the SHE $\vec{\sigma}$ are along +/−x-axis in the substrate plane while the equilibrium position for $\vec{m}_1$ is aligned along the +/−z axis that is perpendicular to the substrate plane. So, the direction of $\vec{m}_1$ and that of $\vec{\sigma}$ are perpendicular to each other and effect of the injected spins is no longer equivalent to an effective damping. Instead the effect of the spin torque can be described using an effective magnetic field $B_{ST}$. The spin torque per unit moment generated by injected spin current can be written as $$\vec{\tau}_{ST} = \frac{\hbar}{2eM_S t} J_S(\hat{m} \times \hat{\sigma} \times \hat{m}),$$

where $\hbar$, e, $M_S$ and t represent the Planck's constant, electron charge, saturation magnetization of the FL and the thickness of the FL, respectively, and $J_S$ is the spin current injected into the FL from the SHE. Meanwhile, the torque generated by a magnetic field in general can be written as $\vec{\tau} = -\hat{m} \times \vec{B}$. By comparing the form of the two torques, the effective magnetic field induced by the spin Hall effect has the form $$\vec{B}_{ST} = -\frac{\hbar}{2eM_S t} J_S \hat{\sigma} \times \hat{m}.$$

Therefore, $\vec{B}_{ST}$ is always perpendicular to $\vec{m}_1$ and points clockwise or counterclockwise, depending upon the direction of the injected spins. FIG. 12C gives an illustration on the direction of $\vec{B}_{ST}$, when the injected spin $\vec{\sigma}$ is along the −x direction. If A is large enough such that $|\vec{B}_{ST}|>0.5 B_{an}^0$, where $B_{an}^0$ is the maximum anisotropy field that the magnetic film can provide, then $\vec{B}_{ST}$ will induce a continuous rotation of $\vec{m}_1$. In a multi-domain ferromagnetic layer, where the coercive field of the magnetic film $B_c$ is smaller than $B_{an}^0$, the corresponding requirement on $\vec{B}_{ST}$ can be loosened to approximately $|\vec{B}_{ST}|>0.5 B_c$. Under the effect of $\vec{B}_{ST}$, $\vec{m}_1$ will be switched continuously, without a deterministic final state. So an external magnetic field has to be introduced in order to get a deterministic switching. In FIG. 12D, an external field in the +y direction is applied as an example. Using $m_z$ to represent the z component of $\vec{m}_1$, it can be seen that the state with $m_z>0$ will become a stable state because $\vec{B}_{ST}$ and $\vec{B}_{ext}$ can be balanced out with each other while $m_z<0$ states are still non-stable because $\vec{B}_{ST}$ and $\vec{B}_{ext}$ works in the same direction, causing $\vec{m}_1$ to continue to rotate. Therefore, under an applied field in the +y direction, spins injected in the −x direction can switch $\vec{m}_1$ into the $m_z>0$ state. By reversing the writing current direction, spins from the SHE will be injected along +x direction, causing $\vec{m}_1$ to be switched into the $m_z<0$ state. In conclusion, by using spins injected from the SHE, a reversible deterministic switching can be realized. The role of the external magnetic field $\vec{B}_{ext}$ is to break the symmetry of the system and to get a definite final state. The magnitude of this field can be as small as a few milli-Telsa (mT) as is demonstrated in the experiment. In one test using the spin current from the SHE to switch the magnetic moment at room temperature, the sample was formed by a 20 um wide, 2 nm thick Pt strip and a 0.7 nm Co magnetic layer in contact with the Pt strip, which has a perpendicular magnetic anisotropy, 1.6 nm of Al is utilized as the capping layer to protect the Co from oxidation by the atmosphere. The anomalous Hall effect is used to monitor the magnetization orientation of the Co layer. Under an external field of +10 mT, the magnetic moment of Co layer can be switched back and forth with opposite applied current. In the device configuration for an MRAM cells, in order to provide the required external field along the current flowing direction, an in-plane magnetized fixed magnetic layer of a few nanometers thickness can be added onto the top of the MTJ. The dipole field generated by this in-plane magnetic layer will give the current induced-switching a deterministic final state. Other configurations of ferromagnetic thin films can also be employed to generate this small external in-plane magnetic field.

Embodiments of the above new 3-terminal MTJ device configuration can be used to solve the reliability challenges that presently limit applications based on various two-terminal MTJ devices while also giving improved output signals. This new 3-terminal MTJ device configuration can also provide the added advantage of a separation between the low-impedance switching (write) process and high-impedance sensing (read) process in MTJ memory devices. More specifically, the devices and methods discloses here combine the spin Hall effect (SHE) with the voltage control of the magnetic anisotropy (VCMA) of nanoscale magnetic elements to enable the electrically gated switching of the magnetic orientation of a bi-stable magnetic element in a magnetic tunnel junction, and the electrical tuning of the oscillation frequency and output power of a spin torque nano-oscillator (STNO). This 3-terminal MTJ design enables more efficient and effective designs of magnetic random access memory circuits and of high performance non-volatile logic circuits, and a new 3-terminal approach to STNO's that provides separate, independent control of the oscillation microwave amplitude and frequency.

In implementations, the materials of the MTJ layers suitable for the disclosed 3-terminal MTJ devices are selected to form a magnetic tunnel junction that exhibits a strong voltage-controlled magnetic anisotropy (VCMA) effect, with its free layer located adjacent to a non-magnetic metallic strip composed of a material having a strong spin Hall effect (SHE) that can carry current flowing in the film plane. In some implementations, the magnetic tunnel junction is comprised of two ferromagnetic thin film elements separated by a thin, less than 2.0 nm thick, insulating layer, typically MgO or some other insulator material, that serves as a tunnel barrier through which electrons can tunnel by a quantum mechanical process. One of the ferromagnetic elements, the pinned layer (PL), which may or may not consist of multiple layers of thin film material, has a fixed magnetization direction, and the other ferromagnetic layer, the free layer (FL), which may or may not consist of multiple layers of thin film material, is free to rotate under the influence of a strong enough spin current or applied magnetic field. Depending on whether the magnetization of the FL is aligned, as result of the action of a spin current, more or less parallel or anti-parallel to the magnetization direction of the PL, the resistance of the MTJ is either in its low resistance state (parallel) or high resistance state (antiparallel). The MTJ is fabricated to have a magnetoresistance change of 10% or more.

The material composition of the insulating layer and the adjacent FL surface are also chosen such that the electronic interface between the two results in a substantial interfacial magnetic anisotropy energy that alters the perpendicular magnetic anisotropy of the FL. Appropriate combinations of material include, but are not limited to, MgO for the insulating layer and for the interfacial surface layer of the FL, Co, Fe, and alloys with Co and/or Fe components. The interfacial electronic structure is such that an electric field that is produced by the application of a voltage bias across the insulator layer can substantially modify the interfacial magnetic anisotropy energy, resulting in a voltage controlled magnetic anisotropy (VCMA) of the FL. In some MTJ device implementations, changes in the interfacial magnetization energy per unit electric field of 25 $\mu J/m^2$ $(V/nm)^{-1}$ or greater can effectuate the necessary change in magnetic anisotropy.

In making the 3-terminal MTJs, the magnetic tunnel junction is fabricated such that its free layer is adjacent to and in good electrical contact with a thin film strip composed of a material that has a high spin Hall angle, e.g., greater than 0.05, as a spin Hall effect (SHE) metal layer to generated a spin-polarized current. For example, in implementations, this SHE metal layer can have a thickness that is less than or no more than approximately five times its spin diffusion length to maintain sufficient spin population in a particular spin state in the generated spin-polarized current at the interface with the free magnetic layer of the MTJ. An electrical current passing through this SHE metial thin film strip can provide, via the spin Hall effect, a transverse spin current that will exert spin torque on the MTJ FL that is sufficient to either efficiently reverse its magnetic orientation, depending on the direction of current flow through the spin Hall layer, or alternatively to excite it into persistent microwave oscillation, while a bias voltage across the MTJ is employed to modify the magnetic anisotropy and/or coercive field of the FL via the VCMA effect. This combination achieves new spin-transfer-torque device functionalities: gate-voltage-modulated spin torque switching and gate-voltage-modulated spin torque oscillation. The former makes possible energy-efficient and gate controlled switching for non-volatile digital logic application, and more energy-efficient and improved architectures for non-volatile digital memory applications, including a simple approach for implementing magnetic memory circuits with a maximum-density cross-point geometry that does not require a control transistor for every MTJ. The latter provides separate, independent control of the microwave oscillation amplitude and frequency of a spin torque nano-oscillator.

Referring to the 3-terminal MTJ device examples herein, a 3-terminal MTJ device can be configured to include a magnetic tunneling junction (MTJ) that includes (1) a pinned magnetic layer having a fixed magnetization direction, (2) a free magnetic layer having a magnetization direction that is changeable, and (3) a non-magnetic junction layer between the magnetic free layer and the pinned magnetic layer and formed of an insulator material sufficiently thin to allow tunneling of electrons between the magnetic free layer and the pinned magnetic layer, and a spin Hall effect metal layer that includes a metal exhibiting a large spin Hall effect to react to a charge current directed into the spin Hall effect metal layer to produce a spin-polarized current that is perpendicular to the charge current, the spin Hall effect metal layer being parallel to and in contact with the free magnetic layer to direct the spin-polarized current generated in the spin Hall effect metal layer into the free magnetic layer. For the gated modulation operation, the 3-terminal MTJ device also includes a first electrical terminal in electrical contact with the MTJ from a side having the pinned magnetic layer to receive a gate voltage that modifies a current threshold of a spin-polarized current flowing across the MTJ for switching the magnetization of the free magnetic layer, and second and third electrical terminals in electrical contact with two contact locations of the spin Hall effect metal layer on two opposite sides of the free magnetic layer to supply the charge current in the spin Hall effect metal layer. A control circuit is coupled to the first, second and third electrical terminals to supply (1) the charge current via the second and third electrical terminals in the spin Hall effect metal layer and (2) the gate voltage across the MTJ causing a small current tunneling across the MTJ that is insufficient to switch the magnetization of the free magnetic layer without collaboration of the spin-polarized current flowing across the free magnetic layer caused by the charge current.

For memory applications, the control circuit in the 3-terminal MTJ device can be specifically configured to be operable in a writing mode to simultaneously apply the charge current in the spin Hall effect metal layer and the gate voltage across the MTJ to set or switch the magnetization direction of the free magnetic layer to a desired direction for representing a stored bit, and, in a read mode, the control circuit is operable to apply a read voltage to the first electrical terminal to supply a read current tunneling across the MTJ between the first electrical terminal and the spin Hall effect metal layer, without switching the magnetization direction of the free magnetic layer, to sense the magnetization direction of the free magnetic layer that represents the stored bit in the MTJ.

Referring to FIGS. 11A and 11B, the SHE is employed as the writing mechanism and a magnetic tunnel junction (MTJ) is employed both to apply the gate voltage that modulates the magnetic orientation of the free layer (FL) during the application of the spin torque effect by the SHE generated spin current, and to sense the magnetic orientation of the bistable free layer relative to that of the fixed reference layer (RL). The MTJ can be a pillar-shaped magnetic device with the lateral dimension generally in the sub-micron or nanometer range. The free ferromagnetic layer with the magnetic moment is made of soft ferromagnetic material with small to medium coercive field. The pinned ferromagnetic layer with magnetic moment is made of soft or hard ferromagnetic material with large coercive field or pinned by additional antiferromagnetic layers. Typical thickness for the free and pinned magnetic layers range from less than one nanometer to a few tens of nanometers. The FL and the PL are separated by a crystalline insulating spacer layer, less than 2 nm in thickness, such as MgO or boron doped MgO (Mg(B)O) or any other crystalline or amorphous insulator layer that generates an interfacial magnetic anisotropy energy density per unit area of contact with the surface of the ferromagnetic free layer that substantially affects the overall magnetic anisotropy of the FL. This magnetic anisotropy energy density can be substantially modified by electric fields applied across the insulator-FL interface. Examples of suitable materials for the magnetic layer may include (but are not limited to) Fe, Co, Ni, alloys of these elements, such as $Ni_{1-x}Fe_x$, alloys of these elements with non-magnetic material, such as $Fe_{1-x}Pt_x$ and $Co_xFe_yB_{1-(x+y)}$, and ferromagnetic multilayers made from those materials, such as $(Co/Ni)_n$, $(Co/Pt)_n$, and $(Co/Pd)_n$ where n represents the repeat number of the multilayer. that the materials for the MTJ structures are selected so that there be a substantial interfacial magnetic anisotropy energy density per unit area of contact between the surface of the ferromagnetic free layer that is in contact with the insulator layer and that this anisotropy vary significantly with the voltage that is applied between a ferromagnetic reference layer on one side of the insulator and the free layer on the other side. Variation is the strength of this applied voltage varies the electric field at the insulator-free layer interface and hence modifies the interfacial magnetic anisotropy experienced by the FL.

In contact with the FL of the magnetic tunnel junction is a non-magnetic thin-film strip made of one of a variety of materials that exhibit a strong spin Hall effect (SHE). Examples of sutaible materials for this layer include high resistivity Ta (beta-Ta), W (beta-W), Hf and Ir layers. Other suitable materials for the SHE layer include (but are not limited to) Pt, Pd, Nb, Mo, Ru, Re, Os, Ir, Au, Tl, Pb, Bi as well as the alloys based upon those transition metals such as $Cu_{1-x}Bi_x$, $Ag_{1-x}Bi_x$, $Cu_{1-x}Ir_x$, $Ag_{1-x}Ir_x$, $Cu_{1-x}W_x$, $Ag_{1-x}W_x$, $Cu_{1-x}Ta_x$, $Ag_{1-x}Ta_x$, $Hf_xIr_y$, and high resistivity intermetallic compounds that incorporate one or more elements with high atomic number, such as compounds with the A15 crystal structure such as $Ta_3Al$, $Nb_3Sn$, $W_3Ge$, $Ir_3Hf$ and other compounds such as TaN, WN and NbN. The non-magnetic SHE strip is patterned into a nanometer scale or micrometer scale width and has a thickness that is less than or approximately equal to five times its spin diffusion length.

In the examples in FIGS. 11A and 11B, three terminals are formed where electrical connections are made to the device. One terminal is on the pillar, close to the PL of the MTJ, and the other two terminals are the two ends of the non-magnetic strip. Writing current is applied between the two terminals on the non-magnetic strip while a bias voltage is applied between the terminal on the pillar and either one of the two terminals on the non-magnetic strip to effect the gating of the switching of the FL magnetization or alternatively to modulate the oscillator frequency in a spin torque nano-oscillation implementation. To read the binary state of the device for a logic gate or memory device implementation, a bias current is applied between the terminal on the pillar and either one of the two terminals on the non-magnetic strip.

In FIGS. 11A and 11B, the FL of the MTJ can be either at the bottom of the pillar, as shown in FIG. 11A, or on the top of the pillar as illustrated in FIG. 11B. In either case the non-magnetic strip with the strong SHE is always adjacent to the FL. When the FL is at the bottom, the non-magnetic strip is also at the bottom of the device, next to the substrate. When the FL is on the top, the PL is placed on the substrate side of the tunnel barrier, the FL is above the tunnel barrier, and the non-magnetic strip is located on the top of the device.

The following describes the VCMA effect by considering only the in-plane spin polarization component of the injected spin-polarized current from SHE.

When the FL and RL are polarized in plane in a 3-terminal MTJ device, and with their in-plane magnetization direction perpendicular to the current direction mentioned above (i.e. along +/−x axis direction), $\overline{m}_1$ is collinear (either parallel or anti-parallel) with the injected spins from the SHE $\vec{\sigma}$. In this case the injected spins from the SHE act as an effective magnetic damping which depending upon the orientation of the spin can be of either sign, i.e. either positive or negative damping. Under this configuration, the SHE induced switching works in the same way as the conventional spin torque induced switching. Conventional spin torque switching employs a pair of ferromagnetic layers separated by a non-magnetic spacer layer, with one ferromagnetic layer being the fixed, polarizer layer, and the other ferromagnetic layer being the free layer whose magnetic moment orientation can be switched by the transfer of spin torque from the polarized current. One difference is that, the spin current in the spin Hall effect device is generated using a non-magnetic material instead of a ferromagnetic polarizer layer. When $\overline{m}_1$ is parallel with $\vec{\sigma}$, the spin current will make the current magnetization orientation more stable, and will not cause switching. Otherwise, when $\overline{m}_1$ is antiparallel with $\vec{\sigma}$, if the spin current is large enough, the magnetization of FL will be switched. Therefore, currents with opposite signs inject spins with an opposite orientation into the FL, and those opposite orientations will result in different preferable orientations of the FL magnetization, so a reversible deterministic switching can be realized by determining the direction of the electrical current through the SHE generating layer.

The result of this combining the spin torque exerted by the spin Hall effect with the voltage-controlled magnetic anisotropy (VCMA) effect is that, in the absence of thermal fluctuations, the critical or threshold current density required to flow through the lateral spin Hall layer to cause spin torque switching of an in-plane polarized magnetic free layer by the spin Hall effect depends on the effective perpendicular demagnetization field $H_{demag}^{eff}$ of the free layer as $$|J_{c0}| \approx \frac{2eM_S t_{free}\alpha}{\hbar\theta_{SH}}(H_c + 0.5H_{demag}^{eff}). \quad (1)$$

As result of the VCMA effect $H_{demag}^{eff}$ is variable as a function of the voltage $V_{MTJ}$ applied across the MTJ:

$$H_{demag}^{eff} = 4\pi M_S - 2K^u(V_{MTJ})/M_S. \quad (2)$$

Here e is the electron charge, $M_S$ is the saturation magnetization of the CoFeB free layer, $t_{free}$ is its thickness and $\alpha$ the value of its Gilbert damping, $H_c$ is its within-plane magnetic anisotropy field, and $K_u(V_{MTJ})$ is the voltage-dependent perpendicular anisotropy energy coefficient of the free layer. Thus as indicated by Equations (1) and (2), the critical current density that is required to flow through the SHE layer to effect the switching of the FL of the MTJ can be modulated by applying a gating voltage to the MTJ. In an implementation of this device by the current inventors $d(H_{demag}^{eff})/dV_{MTJ} = 730 \pm 90$ Oe/V was achieved, corresponding to a change in demagnetization energy per unit electric field $|d(K_u t)/dE| = [M_S t_{free} t_{MgO}/2]d(H_{demag}^{eff})/dV = 70$ µJ/m² (V/nm)$^{-1}$. Values for the modulation of the magnetic anisotropy by the applied electric field that are as much as a factor of 3 lower than 70 µJ/m² (V/nm)$^{-1}$, and values that are higher than this can also be effective in this invention.

For digital logic and gated memory embodiments of this invention the VCMA must be capable of changing the probability of SHE spin torque switching of the MTJ free layer fully between 0% and 100% for a given level of applied current through the spin Hall layer. For long pulse lengths, e.g., greater than 10 ns, and at room temperature and above, thermal activation of the FL can contribute substantially to its reversal. The energy barrier E that the thermal activation energy has to overcome scales directly with the in-plane coercive field $H_c$ of the free layer if the FL is magnetized in plane. Since $H_c$ can depend on the out-of-plane magnetic anisotropy of the FL this means that the gate voltage can act to modulate the spin Hall torque switching current via its effects on both the zero-fluctuation critical current density $|J_{c0}|$ and the activation barrier E. However, for most applications, switching will be driven by spin Hall current pulses in a short duration (e.g., less than 10 ns or 20 ns) for which thermal activation provides little assistance, although it does result in a probabilistic distribution of switching current density about $|J_{c0}|$. Therefore, in this short pulse regime, the gate voltage can effectively modulate the switching current density through its influence on $|J_{c0}|$ alone. For example, an optimized value of the effective perpendicular magnetic anisotropy of the free layer would be $H_{demag}^{eff} \approx 1$ kOe, while $d(H_{demag}^{eff})/dV_{MTJ} \approx 700$ Oe/V has been established as a typical value of the VCMA effect in, for example, a CoFeB/MgO/CoFeB magnetic tunnel junction. Also $H_c$ can be readily adjusted so that it is large enough to maintain the thermal stability of the free layer but Hc is much less than the perpendicular demagnetization field $H_{demag}^{eff}$. Using the typical parameter values $M_S$=1100 emu/cm3, $t_{free}$=1.5 nm, $\alpha$=0.021, and $\theta_{SH}$=0.15, Eq. (2) yields $\oplus J_{c0}|$=9.6×10$^6$ A/cm$^2$ for $V_{MTJ}$=500 mV and $|J_{c0}|$=4.5×10$^6$ A/cm$^2$ for $V_{MTJ}$=−500 mV. This variation of a factor of two in $|J_{c0}|$ is larger than the typical width of the thermal distribution for the switching current density in spin torque devices, so that the effect of the voltage-controlled anisotropy on $J_{c0}$ is sufficient to achieve full modulation of short-pulse, ≤20 nanosecond, spin Hall torque switching of the Fl in optimized spin Hall spin torque devices.

Figure 13A:
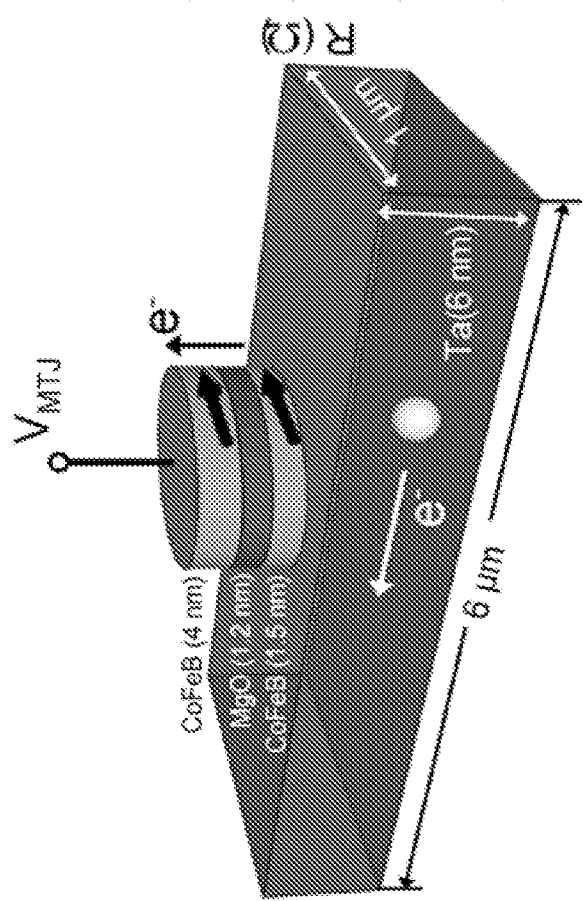
FIG. 13A shows an example 3-terminal MTJ device for demonstrating the capability of the effect of voltage control of the magnetic anisotropy (VCMA) to modulate the spin Hall torque switching of the FL of the MTJ.
Figures 13B, 13C:
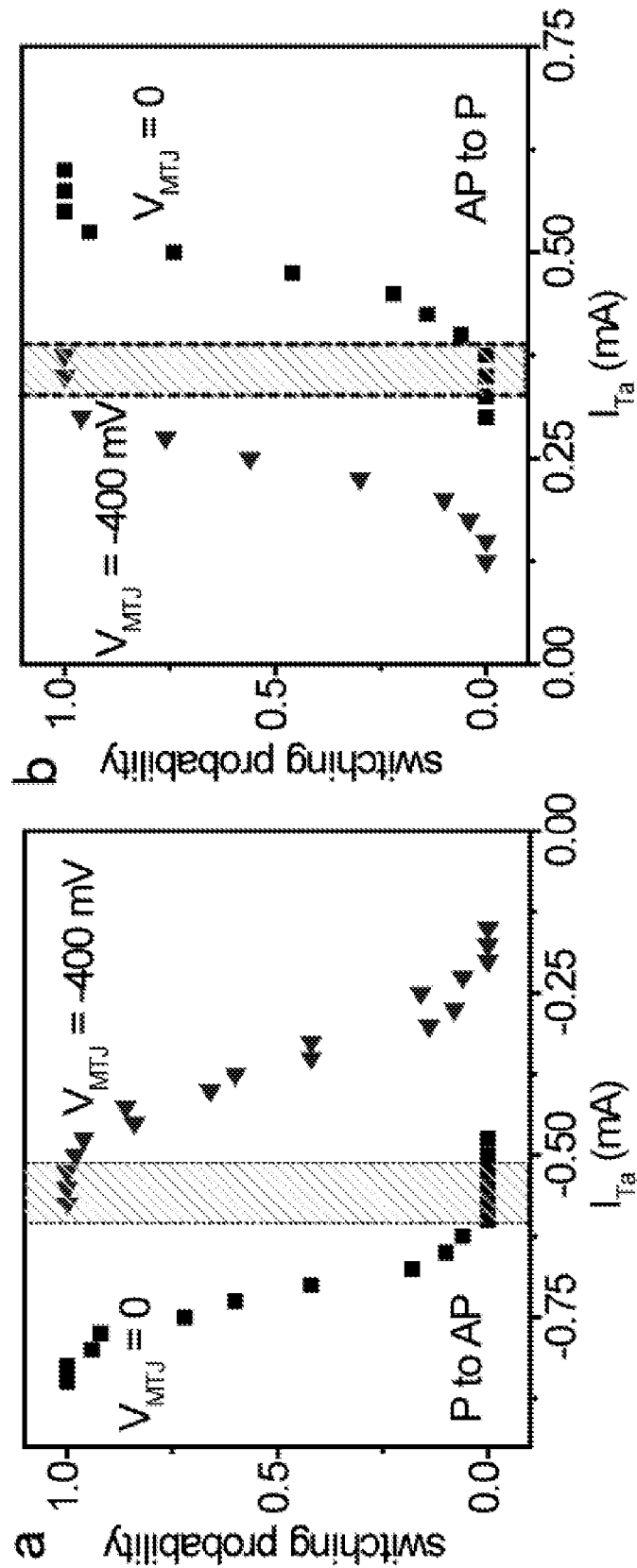
FIGS. 13B and 13C illustrate operation of a bias voltage, $V_{MTJ}$, applied across the tunnel junction terminals in a 3-terminal SHE device to substantially alter the current $I_{Ta}$ required through the spin Hall layer to effect either parallel to anti-parallel (P to AP) switching (FIG. 13A) or anti-parallel to parallel (AP to P) switching (FIG. 13B), where the shaded areas indicate the current range in which the ON state ($V_{MTJ}$=−400 mV) and the OFF state ($V_{MTJ}$=0 mV) alter the switching probability from 100% to zero.
Figure 13D:
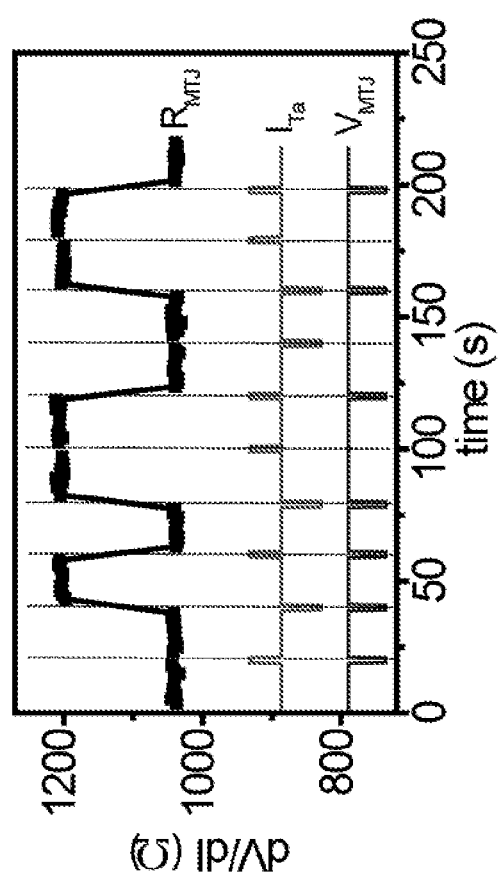
FIG. 13D illustrates gated spin Hall torque switching under a series of 10 μs pulses, where $R_{MTJ}$ is the resistance of the MTJ (data state). To achieve the gated switching to the high resistance state, $V_{MTJ}$ is switched between 0 mV and −400 mV, while the spin Hall current $I_{Ta}$ is switched between 0 mA and −0.55 mA. To achieve the gate switching to the low resistance state, $V_{MTJ}$ is switched between 0 mV and −400 mV, while the spin Hall current $I_{Ta}$ is switched between 0 mA and 0.35 mA. Switching does not occur unless the $V_{MTJ}$=−400 mV pulse is applied.

A sample 3-terminal MTJ device was fabricated using a 6 nm thick, 1 μm wide Ta strip as the SHE metal layer and a MTJ stack of $Co_{40}Fe_{40}B_{20}$(1.5)/MgO(1.2)/$Co_{40}Fe_{40}B_{20}$(4) (thicknesses in nanometers) on top of the Ta SHE metal layer (FIG. 13A. The MTJ stack is shaped to be an approximately elliptical cross section of 100×350 nm$^2$ with the long axis perpendicular to the Ta SHE strip. The sample MTJ device was tested to demonstrate the capability of the VCMA effect to modulate the spin Hall torque switching of the FL of the MTJ by using a long, pulse regime (~10 μs). The test results are shown in FIGS. 13B and 12C, using $V_{MTJ}$=0 and −400 mV. For both P-to-AP (FIG. 13B) and AP-to-P (FIG. 13C) switching there is a window of current amplitude for which the switching probability is 100% for $V_{MTJ}$=−400 mV and 0% for $V_{MTJ}$=0, so that $V_{MTJ}$ gates the switching process effectively. This is shown directly in FIG. 13D; a voltage $V_{MTJ}$=−400 mV puts the device in the ON state for switching by the spin Hall torque from the Ta, while $V_{MTJ}$=0 turns the switching OFF. FIG. 13D also demonstrates how this 3-terminal device achieves fundamental logic operations by combining spin Hall torque switching with the VCMA effect. More complicated logic functions can be obtained by combining more than one spin Hall torque/VCMA device.

To achieve a large spin Hall effect sufficient for efficient switching of either an in-plane or out-of-plane magnetized magnetic free layer requires the use of a thin film material comprised of one or more metallic atomic elements with a high atomic number, and one in which there a strong spin-orbit interaction between the conduction electrons and the metallic ions. Materials that are suitable for the disclosed 3-terminal MTJ devices include the high atomic number (Z) metallic elements Ta, W, Hf and Ir, all of which, in the appropriate atomic structural form, have spin Hall angles of greater than 0.08 and in some cases greater than 0.25. Alloys and intermetallic compounds of these elements and in combination with other high Z elements may also be used. However a metal layer with a high atomic number is not in and of itself sufficient for effective use as the source of the spin current in this invention. In various implementations, the material is selected to have particular electronic properties and an optimal crystalline structure, including in relation to the properties and structure of the adjacent ferromagnetic layer on which the spin current generated by the spin Hall effect in the first layer acts to effect the magnetic switching or the excitation of that second, ferromagnetic layer.

First, the electronic properties of the spin Hall metal can be configured such that there is a high efficiency in the generation of a transverse spin current density by a longitudinal electronic current density with that conversion efficiency being quantified by what is known as the spin Hall angle which is defined as the ratio of the transverse spin conductivity to the longitudinal electronic conductivity, or equivalently the ratio of the generated transverse spin current density to applied longitudinal electrical current density. When a crystalline metal is employed and in the case where the spin Hall effect is intrinsic and arises from the spin-orbit interaction between the conduction electrons and the fixed ionic crystalline lattice structure, which then determines the transverse spin conductivity of the material, the electrical conductivity of the metal should be low so that the spin Hall angle, or efficiency of the generation of the transverse spin current, is high. In the instance, which can also be employed for this invention, where the spin Hall effect is not intrinsic but is determined by the spin-dependent scattering of the conduction electrons by impurities and crystalline defects, that spin-dependent scattering must be made strong by choice of the impurities or defects, relative to the any non-spin dependent scattering of the electrons.

Second, the spin relaxation length within the spin Hall metal is desired to be short, e.g., less than or equal to 1 nm up to approximately 5 nm. The thickness of the spin Hall layer, in order to optimize conversion efficiency, is no less than approximately one spin relaxation length and no more than approximately five times the spin relaxation length. The current required to effect the magnetic switching or excitation of the adjacent magnetic layer scales directly with the thickness of the spin Hall layer times the spin Hall angle of the material. Therefore to minimize the required switching current a thin spin Hall layer with a high spin Hall angle and a short spin diffusion length is optimal.

Third, the electronic structure of the spin Hall material and of the adjacent ferromagnetic material is selected such that a conduction electron from the spin Hall layer can pass readily across the interface into the ferromagnetic layer if the magnetic moment of the electron is aligned either parallel, or in some cases anti-parallel but usually parallel, to the orientation of the magnetization of the ferromagnetic layer and has a low probability of passing into the ferromagnetic layer if the electron's magnetic moment has the opposite orientation relative to that of the ferromagnetic layer's magnetization. In the case of a crystalline spin Hall material and a crystalline ferromagnetic layer the electronic band structures of the two materials must be such that the probability of electron transmission from the spin Hall material across the interface and into either the majority electron sub-band structure or the minority electron sub-band structure of the ferromagnetic layer is much greater in one case than the other. The band structure of the beta form of Ta, which is generally reported to have tetragonal crystalline symmetry, is sufficiently different from that of typical ferromagnetic materials, such as FeCo and NiFe alloys as to meet this requirement. This is also the case for the beta form of W, which is generally reported to have the A15 crystalline symmetry. For Hf, which can be found in multiple crystalline forms, including hexagonally close packed (hcp) and face-centered cubic (fcc) forms, the choice of the crystalline form relative to that of the composition and crystalline form of the ferromagnetic layer is critical to obtaining a combination with a high spin torque efficiency.

Fourth, in implementations where the incident spin current from the spin Hall layer excites and then reverses the orientation of the ferromagnetic layer by the exertion of an anti-damping spin torque, it is also required that the injection of spins from the magnetically precessing ferromagnetic material during this excitation process back into the spin Hall material is minimized. This injection is known as spin pumping and is generally considered to depend on the probability of electronic transmission across the interface per unit area, where the transmission probability is dependent upon the spin orientation of the electron relative to that orientation of the magnetization direction of the ferromagnet. A high spin pumping rate acts to damp the magnetic excitation of the ferromagnet and hence leads to the undesirable requirement of a stronger incident spin current density to effect the magnetic switching. This spin pumping process is generally characterized by a parameter known as the interfacial spin-mixing conductance. For optimal performance this spin-mixing conductance should be minimized, well below that found in most conventional combinations of ferromagnetic materials and high atomic number spin Hall materials. For example the Co—Pt combination has a high spin mixing conductance, as does the combination of CoFe (or CoFeB) with alpha-W, that is W in the standard bcc crystalline form. However both beta-Ta and beta-W in combination with ferromagnetic layers such as CoFe, CoFeB and NiFe alloys exhibit a low spin-mixing conductance, which makes these combinations effective for the anti-damping switching embodiment of this invention.

A spin Hall material suitable for implementing the 3-terminal MTJ devices can be selected or designed to have a strong spin orbit interaction (with a high spin Hall angle and associated high spin current density generation efficiency), and a short spin relaxation length for efficient injection of the spin-polarized electrons or other charge particles into the FL from the SHE metal layer, (e.g., approximately 1 to 5 nm). Furthermore the interfacial electronic structures of the two materials are configured such that the incident spin current exerts a highly efficient spin torque on the ferromagnetic material, this depends on a strong difference in the spin dependent electron transmission probabilities of the interface. In some implementation, the 3-terminal MTJ devices can be configured to utilize anti-damping excitation of the ferromagnetic material to effect the switching the interfacial electronic properties so that the spin pumping efficiency, or equivalently that the spin mixing conductance, of the interface is quite low.

In addition, the insulating spacer layer for the 3-terminal MTJ devices can range in thickness, e.g., from less than 1 nm to greater than 2 nm in some implementations. The insulating spacer layer can be composed of polycrystalline MgO or mixed oxide such as $Mg_xB_yO_z$ of variable composition, or any other crystalline or amorphous insulator layer that results in a high tunneling magnetoresistance for currents flowing between the ferromagnetic reference layer and ferromagnetic free layer placed on the opposing sides of the insulating layer, and that also results in an interfacial magnetic anisotropy energy density per unit area of contact with the surface of the ferromagnetic free layer (FL) that substantially affects the overall magnetic anisotropy of that thin FL, and where this magnetic anisotropy energy density can be substantially modified by electric fields applied across the insulator-FL interface.

Some examples of the materials for the magnetic free layer may include (but are not limited to) Fe, Co, Ni, alloys of these elements, such as $Fe_{1-x}Co_x$, $Ni_{1-x}Fe_x$, alloys of these elements with non-magnetic material, such as $Fe_{1-x}Pt_x$ and $Co_xFe_yB_{1-(x+y)}$, and ferromagnetic multilayers made from those materials, such as $(Co/Ni)_n$, $(Co/Pt)_n$, and $(Co/Pd)_n$ where n represents the repeat number of the multilayer. Such materials should exhibit a substantial interfacial magnetic anisotropy energy density per unit area of contact between the surface of the ferromagnetic free layer that is in contact with the insulator layer. This interfacial anisotropy can vary significantly with the voltage that can be applied between a ferromagnetic reference layer on one side of the insulator and the free layer on the other side. Variation in the strength of this applied voltage changes the electric field at the insulator-free layer interface and hence modifies the interfacial magnetic anisotropy experienced by the FL.

The current that flows through the insulator layer of the magnetic tunnel junction during the electrically gated switching operation can be varied over a wide range by choice of the insulator material and its thickness. The tunneling resistance of such an insulator layer varies exponentially with its thickness, typically increasing by about one order of magnitude for a 0.2 to 0.3 nm increase in thickness, as in the case of an MgO insulator layer in an MTJ. Thus by using a relatively thick >1.5 nm MgO layer, for example, the tunnel current that flows through the insulator layer due to the voltage bias can be quite low during the gated spin Hall switching operation. This can reduce the energy required for the gate component of the switching operation to the level of that required to charge the voltage across the tunnel barrier which acts as a capacitor in this case. The voltage required to execute the gated response does vary linearly with insulator layer thickness, so that a thicker barrier does require a proportionately higher gate voltage to execute the gated response. Thus the insulator thickness should be typically kept to be ≤2 nm in some applications.

Alternatively if the insulator layer is made thin, of the order of 1 nm, then the current that flows through the insulator layer when a voltage bias is applied to modulate the interfacial anisotropy of the free layer can be substantial. Depending on the relative orientation of the FL relative to the RF, and on the polarity of the voltage bias and hence the direction of the tunneling electron flow, this current will exert a spin torque on the FL that will either aid or hinder the spin torque switching of the FL by a current that is also applied to flow through the adjacent spin Hall metal layer. This can add extra flexibility in designing the device for optimum switching performance and for also achieving maximum thermal stability in the absence of gated switching pulses. The insulator thickness should be thick enough such that the current that flows when a bias voltage that is required to be applied to read the magnetoresistive state of the MTJ during a read operation is not sufficient to independently effect a switching of the free layer due to the spin torque exerted by the tunnel junction, without the aid of any spin torque being generated by a bias current flowing through the spin Hall metal layer.

In addition to providing a new, basic element for high-performance non-volatile logic circuits, embodiments of the present 3-terminal MTJ designs enable improved circuit architectures for high-performance magnetic memory logic technologies. For example, this spin Hall torque/VCMA device can be employed to produce nonvolatile magnetic random access memory circuits in the maximum-density cross-point geometry shown schematically in FIG. 8. A major challenge for the successful implementation of cross-point memories using conventional spin torque switching with 2-terminal magnetic tunnel junctions is the issue of current flow via sneak paths that leads to unintended switching events and increased power consumption during writing processes and decreased sensitivity during reading. In the circuit shown in FIG. 8, during the writing operation each memory cell can be addressed individually by applying a gate voltage to the MTJ from above while also applying a current through the SHE microstrip below to generate a spin Hall torque.

Figure 14:
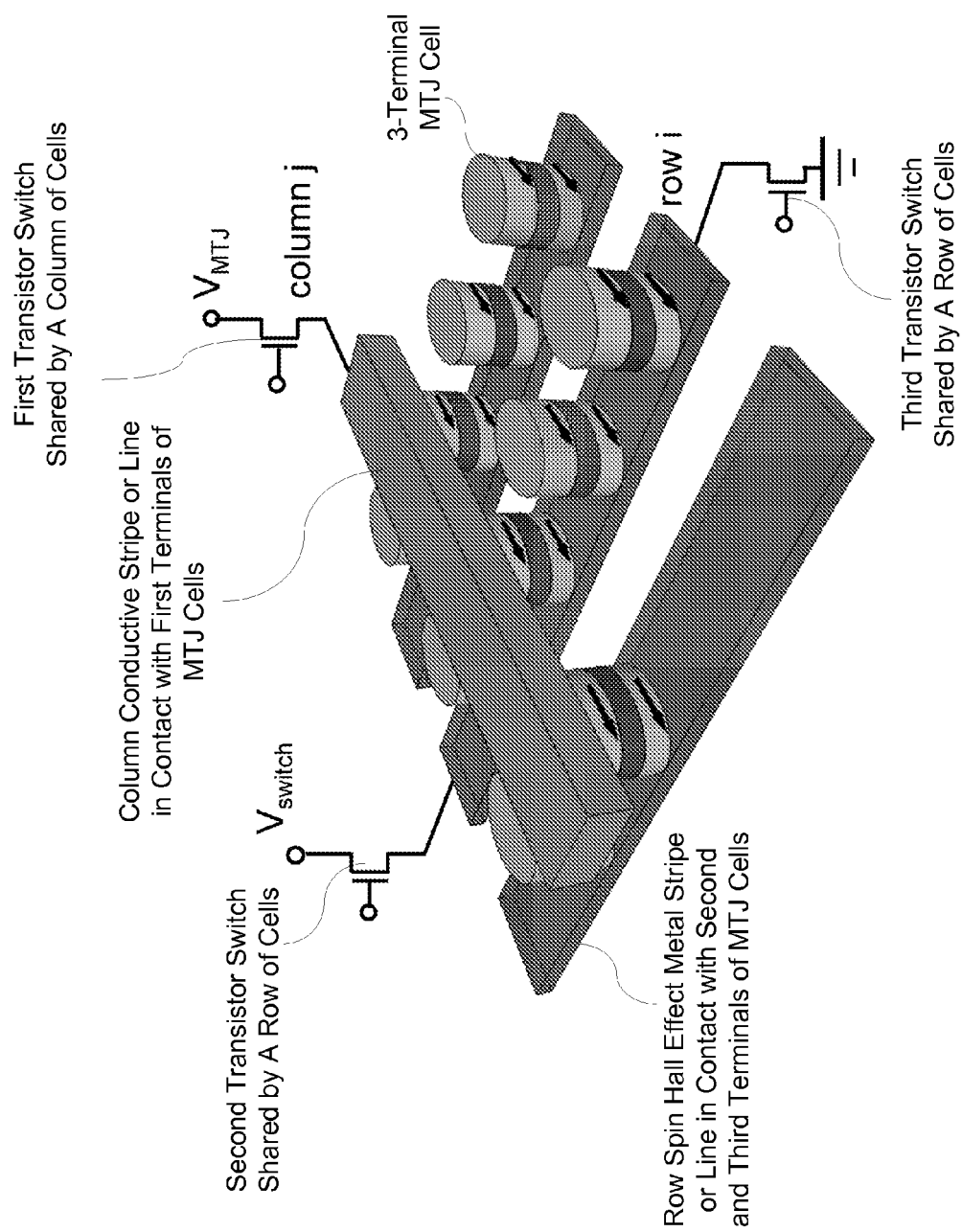
FIG. 14 provides an example of a cross-point memory architecture enabled by gated spin Hall torque switching for an array of 3-terminal memory cells based on coupling between MTJ and the spin Hall effect metal layer where transistor switches are shared and coupled to the three terminals of MTJ cells.

The device in FIG. 14 includes rows and columns of 3-terminal MTJ memory cells. Rows of spin Hall effect metal stripes are provided and each row spin Hall effect metal stripe is configured to be in contact with a row of memory cells as the spin Hall effect metal layer for each memory cell in the row of memory cells and is further coupled to the memory control circuit to carry a row charge current as the charge current for each memory cell in the row of memory cells. The device in FIG. 14 also includes columns of conductive stripes and each column conductive stripe is configured to be in contact with a column of memory cells respectively located in different rows of memory cells and further coupled to the memory control circuit to apply a row gate voltage as the gate voltage, or a row read voltage as the read voltage, for each memory cell in the column of memory cells. The memory control circuit includes first transistors coupled to the column conductive stripes, respectively, one first transistor per column conductive stripe to apply the row gate voltage or the row read voltage to the first electrical terminals of the memory cells; and second transistors coupled to the row spin Hall effect metal stripes, respectively, one second transistor per row spin Hall effect metal stripe to connect to the second electrical terminals to switch on or off the row charge current in the respective row spin Hall effect metal stripe as the charge current for each memory cell in a corresponding row of memory cells. In some implementations, the third electrical terminals are grounded. In the example in FIG. 14, this grounding is controlled by third transistors coupled to the row spin Hall effect metal stripes, respectively, one third transistor per row spin Hall effect metal stripe to connect between the third electrical terminals of memory cells in a corresponding row of memory cells and an electrical ground.

Figure 15:
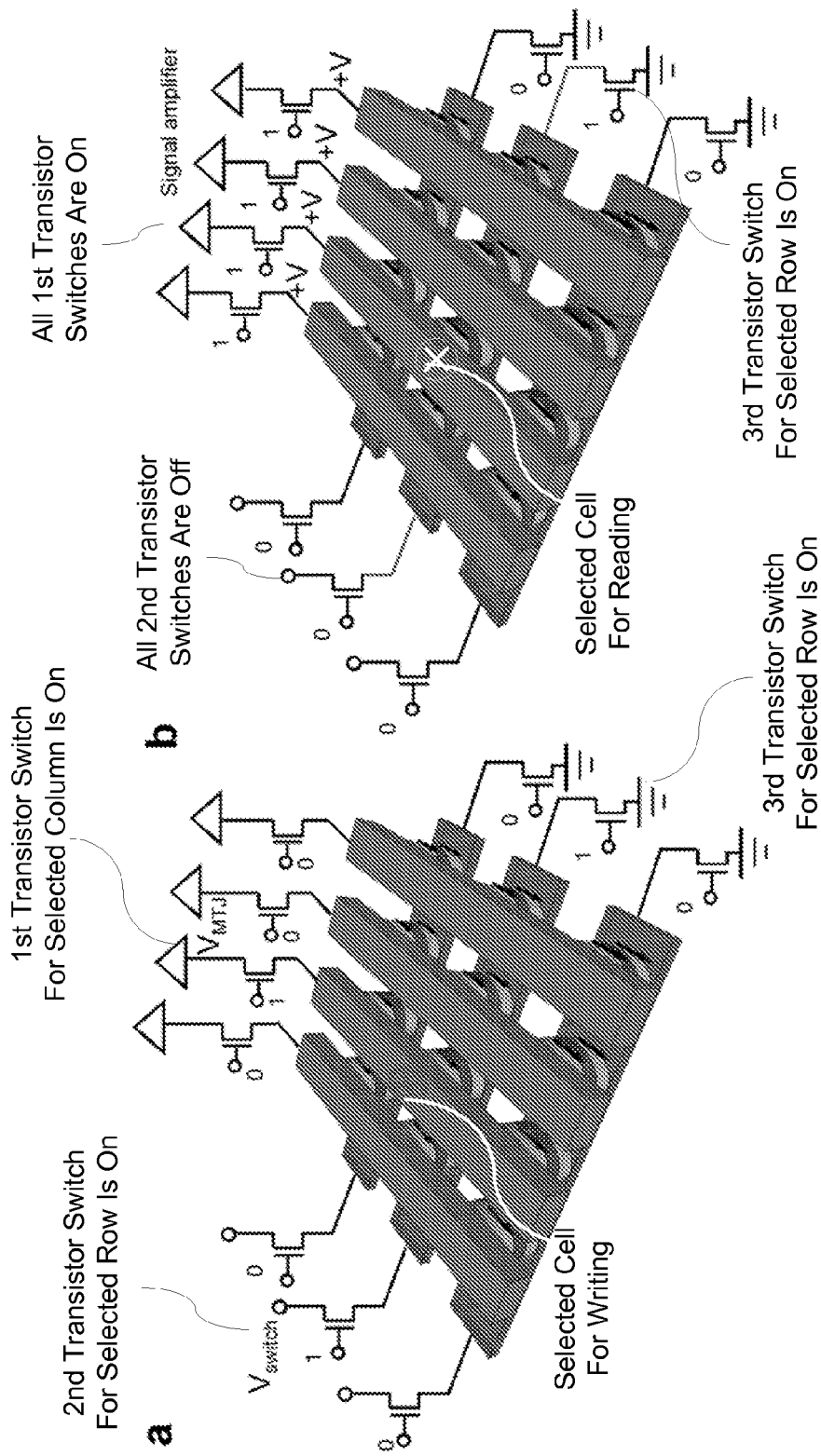
FIGS. 15A and 15B illustrates examples of transistor switch operation status for bias configurations that can be employed for the writing and reading operations in the gated spin Hall torque cross-point memory architecture in FIG. 14.

FIGS. 15A and 15B show examples of operations of the first, second and third transistors in FIG. 14 during writing and reading operations. More specifically as illustrated in FIG. 15A for the writing operation, the first transistor at the chosen column and the pair of the second and third transistors at the two ends of the chosen row are set to be ON while all of the other transistors are set to be OFF. $V_{switch}$ is chosen to be positive or negative depending on which final state is desired for the MTJ. Information is then written into the selected MTJ for the writing operation. MTJs with high impedance can be utilized such that $R_{MTJ}$, the impedance of the tunnel junction, is much greater than $R_{Ta}$, the resistance of the SHE strips. This condition effectively blocks all possible sneak paths for the writing current. For the reading operation shown in FIG. 15B, a parallel reading scheme can be employed to effectively ameliorate the effect of sneak currents. The second transistors for all of the columns and the third transistor at the right end of the chosen row are set to be ON. All of the other transistors are set to be OFF. Therefore, all of the column lines are set at the same read voltage level +V. Information is read in a parallel way from all the MTJs on the same row by measuring the currents flowing in the column lines.

The overall benefit of the cross-point architecture as illustrated in the examples in FIGS. 14, 15A and 15B is that whereas some 2-terminal spin-torque MRAM circuits require at least 1 transistor for every bit, the cross-point geometry for the present 3-terminal MTJ circuits can be made with only 1 transistor for every N bits in an array, thereby increasing the storage density significantly and reducing the complexity at the interface between the MTJs and the semiconductor (CMOS) circuit elements that provide the write signals and perform the read-out of the stored data.

Referring to FIGS. 12A and 12B where the magnetic layers of the MTJ are perpendicular the MTJ layers, the effect of the spin torque from the spin current generated by the SHE can be described using an effective magnetic field $H_{ST}$. The spin torque per unit moment generated by injected spin current can be written as $$\tau_{ST} = \frac{\hbar}{2eM_S t} J_S \hat{\sigma} \times \hat{m},$$

where $\hbar$, e, $M_S$ and t represent Planck's constant, electron charge, saturation magnetization of the FL and the thickness of the FL, respectively, and $J_S$ is the spin current injected into the FL from the SHE. Meanwhile, the torque generated by a magnetic field in general can be written as $\vec{\tau} = \hat{m} \times \vec{H}$. By comparing the form of the two torques, the effective magnetic field induced by the spin Hall effect has the form $$\vec{H}_{ST} = -\frac{\hbar}{2eM_S t} J_S \hat{\sigma} \times \hat{m}.$$

Therefore, $\vec{H}_{ST}$ is perpendicular to $\overline{m}_1$ and points clockwise or counterclockwise, depending upon the direction of the injected spins. If $J_S$ is large enough such that $|\vec{H}_{ST}| > 0.5 H_{an}^{eff}$, where $H_{an}^0$ is the maximum anisotropy field that the magnetic film can provide, then $\vec{H}_{ST}$ will induce a continuous rotation of $\overline{m}_1$. Under the effect of $\vec{H}_{ST}$, $\overline{m}_1$ will be switched continuously, without a deterministic final state. To achieve deterministic switching an external in-plane magnetic field $\vec{H}_{ext}$ has to be introduced, which can be easily provided by the magnetic dipole field of a magnetic layer placed nearby. The external field can be generated by using one or more magnetic elements in the device in various configurations. In FIG. 6B, an external field in the +y direction is applied as an example. Using $m_z$ to represent the z component of $\overline{m}_1$, it can be seen that the state with $m_z > 0$ will become a stable state because $\vec{H}_{ST}$ and $\vec{H}_{ext}$ can be balanced out with each other while $m_z < 0$ states are still non-stable because $\vec{H}_{ST}$ and $\vec{H}_{ext}$ act in the same direction, causing $\overline{m}_1$ to continue to rotate. Therefore, under an applied field in the +y direction, spins injected in the −x direction can switch $\overline{m}_1$ into the $m_z > 0$ state. By reversing the writing current direction, spins from the SHE will be injected along +x direction, causing $\overline{m}_1$ to be switched into the $m_z < 0$ state. By using spins injected from the SHE, reversible deterministic switching is realized.

The current through the SHE layer that is required to effect the deterministic switching of the FL scales linearly with the effective perpendicular magnetic anisotropy field $H_{demag}^{eff}$ of the FL for the case where the FL and RL are polarized perpendicular to the plane. If $H_{demag}^{eff}$ is adjusted to be, for example, ~1000 Oe or less, which is readily achievable through choice of the FL material, its thickness and careful thermal annealing strong gating of the SHE switching current can be readily obtainable with SHE/VCMA that incorporate MTJ's that have a VCMA of the order of $d(H_{demag}^{eff})/dV^{MTJ} \approx 700$ Oe/V, as has been experimentally demonstrated (see FIG. 7C).

Another application of the present 3-terminal MTJ device design for combining spin Hall torque with voltage controlled magnetic anisotropy is to employ these effects to achieve new, independent control of the frequency and amplitude of output power of a spin torque nano-oscillator (STNO). Such a device for generating an oscillation signal based on a magnetic tunneling junction in a three-terminal circuit configuration can be configured to include a magnetic tunneling junction (MTJ) that includes (1) a pinned magnetic layer having a fixed magnetization direction in the pinned magnetic layer, (2) a free magnetic layer having a magnetization direction that is in the free magnetic layer and is changeable, and (3) a non-magnetic junction layer between the magnetic free layer and the pinned magnetic layer and formed of an insulator material sufficiently thin to allow tunneling of electrons between the magnetic free layer and the pinned magnetic layer. A spin Hall effect metal layer is provided to be nonmagnetic and includes a metal exhibiting a large spin Hall effect to react to a charge current directed into the spin Hall effect metal layer to produce a spin-polarized current that is perpendicular to the charge current. The spin Hall effect metal layer is parallel to and in contact with the free magnetic layer to direct the spin-polarized current generated in the spin Hall effect metal layer into the free magnetic layer. This device includes a first electrical terminal in electrical contact with the MTJ from a side having the pinned magnetic layer; and second and third electrical terminals in electrical contact with two contact locations of the spin Hall effect metal layer on two opposite sides of the free magnetic layer to supply the charge current in the spin Hall effect metal layer. An oscillator control circuit in this device is coupled to the first, second and third electrical terminals to supply (1) a constant current as the charge current via the second and third electrical terminals in the spin Hall effect metal layer to cause a precession of the magnetization of the free magnetic layer due to the spin-polarized current produced by the spin Hall effect metal layer, and (2) a MTJ junction current directed via the first electrical terminal across the MTJ to cause a current tunneling across the MTJ that oscillates due to the precession of the of the magnetization of the free magnetic layer. This control circuit is configured to adjust the MTJ junction current to control an oscillation frequency or an amplitude of the oscillation in the current tunneling across the MTJ.

Figure 16:
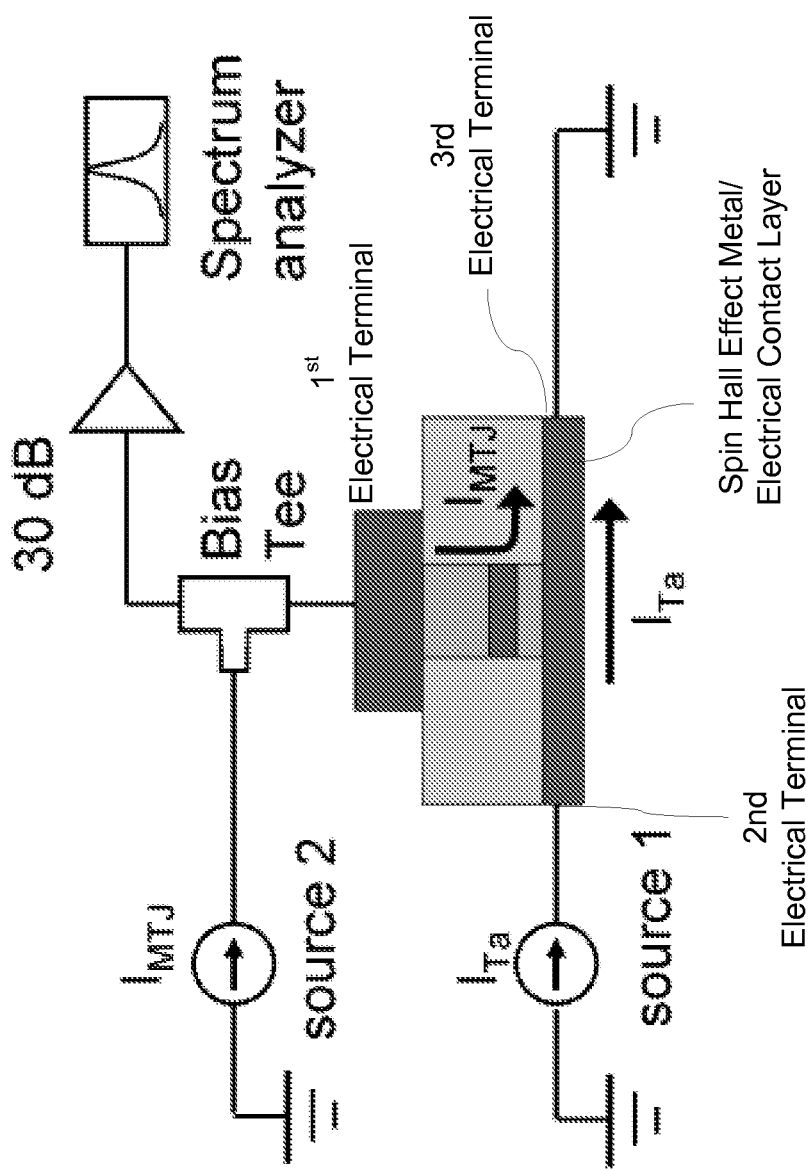
FIG. 16 illustrates an example of an oscillation circuit that can be used to excite magnetic oscillation in a 3-terminal SHE/VCMA device and output the associated microwave power to achieve spin torque nano-oscillator performance. The black arrows denote the current distribution inside the three terminal SHE device and the spin Hall current $I_{Ta}$ and the tunnel junction bias current $I_{MTJ}$ come from current source 1 and current source 2, respectively.

FIG. 16 shows an example of such an oscillator circuit for exciting and detecting the magnetic dynamics in the SHE device. Two DC current sources with common ground can be employed to separately apply current through the SHE strip and through the MTJ. The current through the SHE strip $I_{SHE}$ injects spin current into the magnetic free layer of the MTJ through the SHE and excites magnetic dynamics therein, while the MTJ bias current $I_{MTJ}$ converts the oscillations of the MTJ resistance $R_{rf}$ arising from the TMR into an oscillating voltage $V_{rf} = I_{MTJ} R_{rf}$ which can then be coupled to a microwave strip-line or antenna.

In comparison, a conventional 2-terminal MTJ STNO device would have to use the same two terminals to carry the same current as both (1) the driving current to excite the dynamics and (2) the sensing current to provide the output power. The 3-terminal SHE/VCMA device in FIG. 16 uses two separate currents for these functions, respectively, to provide better technical controls and operation advantages.

Figure 17:
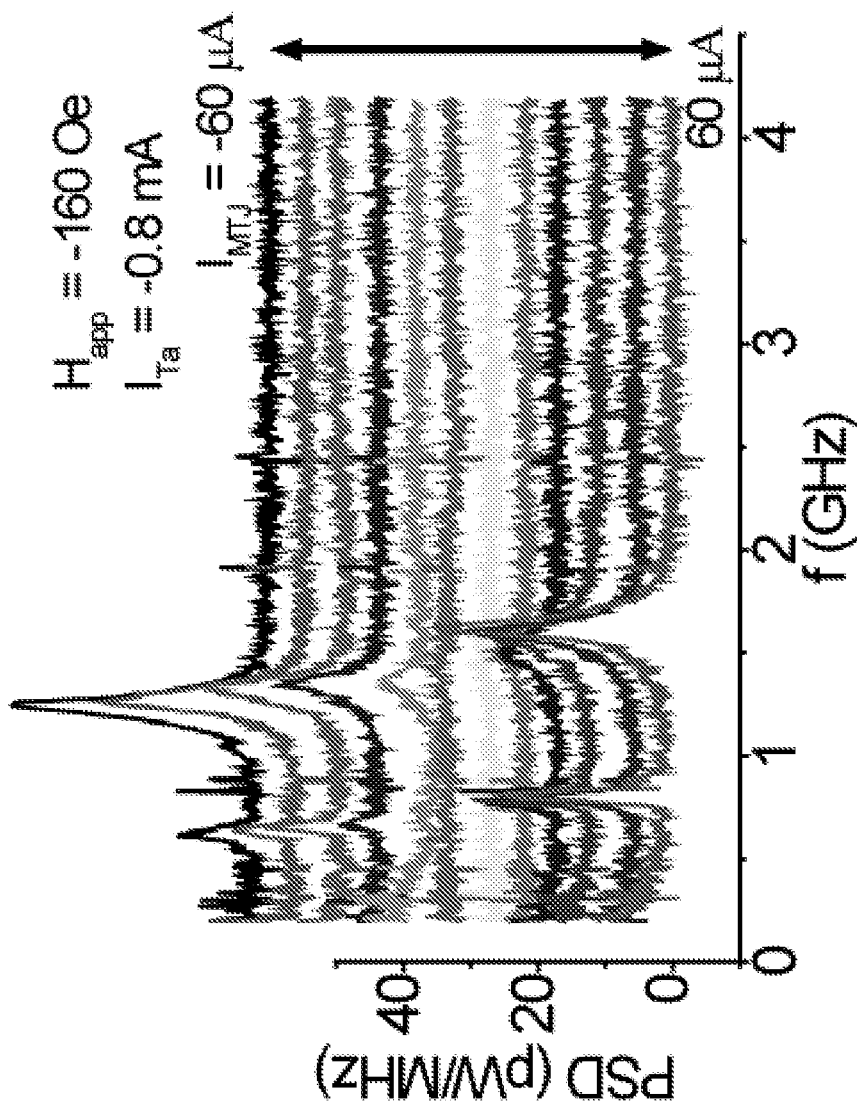
FIG. 17 shows the microwave spectra produced by a spin Hall torque excited FL in a magnetic tunnel junction when the MTJ bias current is $I_{MTJ}$=60 μA, and the spin Hall current in the spin Hall metal (Ta) strip is varied between $I_{Ta}$=−0.8 mA and +0.8 mA. The spectra under different currents are shifted vertically for the ease of comparison. The power spectrum density (PSD) is a measure of the output microwave power of the device.
Figures 18A, 18B:
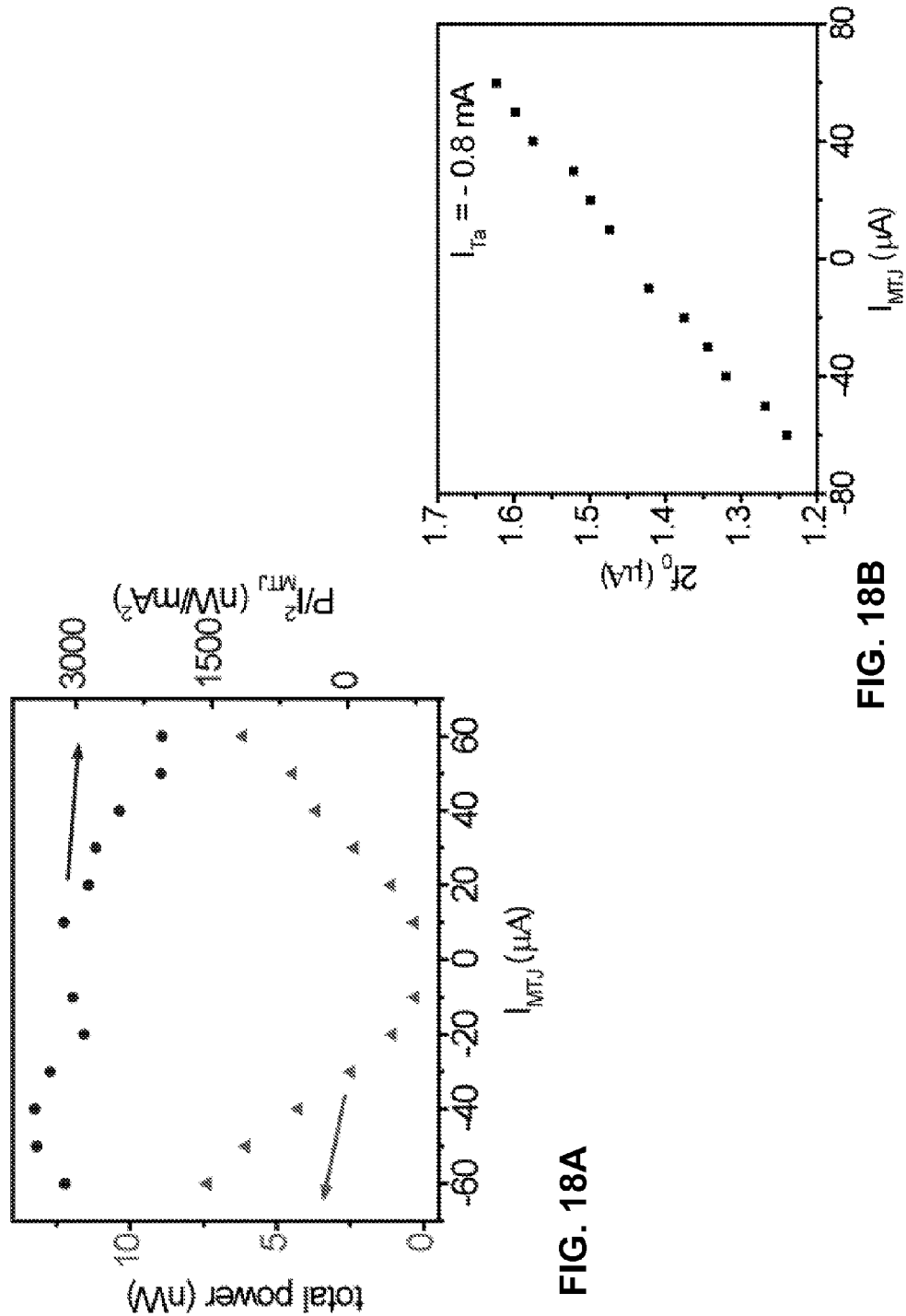
FIG. 18A shows the integrated output microwave power of a SHE driven spin torque nano-oscillator as indicated schematically in FIG. 16. The red triangles represent the microwave power versus the applied MTJ current. The blue circles represent the microwave power normalized by $I_{MTJ}^2$ and the magnetoresistance of the corresponding current.
FIG. 18B shows the center oscillation frequency of a SHE excited and VCMA tuned spin torque nano-oscillator in FIG. 16 as the function of the applied MTJ current.

FIG. 17 shows the microwave spectra obtained with a prototype SHE/VCMA STNO for different $I_{MTJ}$ while $I_{SHE}$ is held constant. Since the sensing current has little or no influence on the magnetic dynamics, unlike the case for conventional STNO's, the output power P scales as $I_{MTJ}^2$ as shown in FIG. 18A which displays the integrated power P (triangles) of the 3-terminal STNO prototype and its normalized power (circles) vs. $I_{MTJ}$, where $T(I_{MTJ})$ is the bias-dependent normalized TMR value of the MTJ. The normalized power is roughly constant with bias.

As illustrated in FIG. 18B, an important aspect of the behavior of this three-terminal STNO is a quite significant blue shift of the oscillator frequency as $I_{MTJ}$ is increased in the positive direction. This is quantitatively related to the perpendicular magnetic anisotropy change induced by the changes in the electric field across the MgO tunnel barrier as $I_{MTJ}$ is varied. Thus as demonstrated by FIGS. 18A and 18B, the 3-terminal STNO embodiment of the spin Hall effect in combination with voltage control magnetic anisotropy enables independent control of the magnetic dynamics and the output electric power of a spin torque nano-oscillator, therefore providing a greater and more versatile tuning of the frequency and variation of the amplitude of the output microwave signal.

In implementing 3-terminal MTJ devices based on two independent control mechanisms, it is desirable to produce a sufficiently large effective perpendicular demagnetization field $H_{demag}^{eff}$ of the free layer as indicated in Equations (1) and (2) to affect the critical or threshold spin-polarized current for switching the magnetization of the free magnetic layer. Various material combinations can be selected for the MTJ device, including proper transitional metal elements in desired crystalline phases. One technique for achieving a sufficiently large effective perpendicular demagnetization field $H_{demag}^{eff}$ of the free layer is to provide a thin transition metal layer between the free magnetic layer and the SHE metal layer as shown in the MTJ example in FIG. 19.

Figure 19:
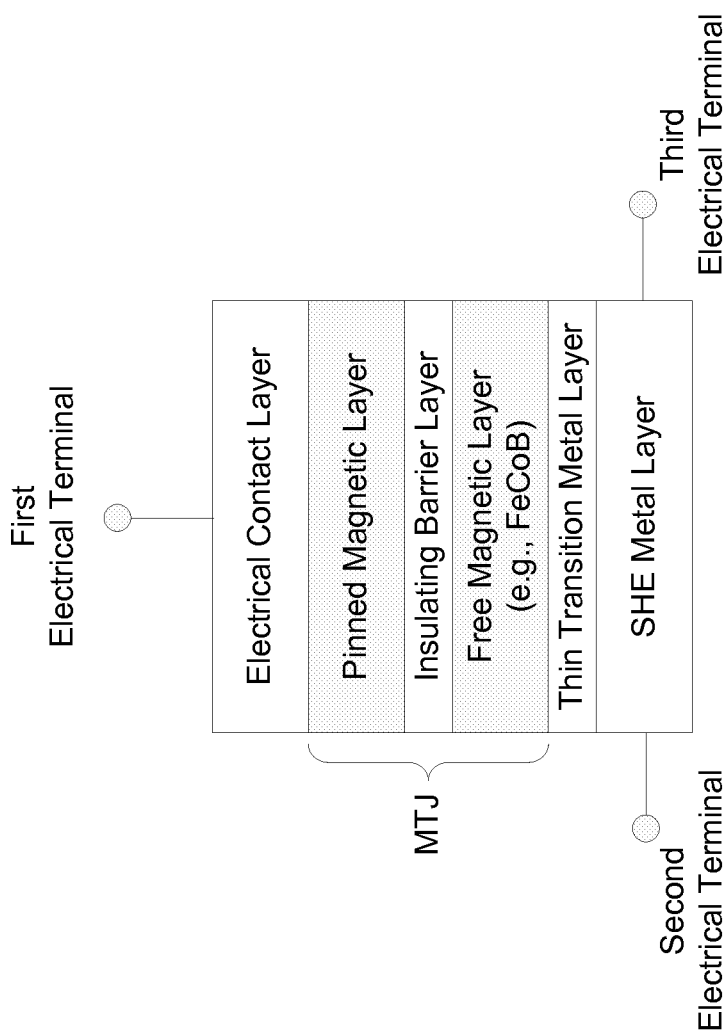
FIG. 19 shows an example of a 3-terminal MTJ device having a thin transition metal layer between the free magnetic layer and the SHE metal layer for enhancing the perpendicular magnetic anisotropy in the free magnetic layer.

In FIG. 19, the material and the thickness of the thin transition metal layer are selected with respect to the material configurations of the free magnetic layer and the SHE metal layer to enable the interfacing between the thin transition metal layer and free magnetic layer to produce a strong interfacial anisotropy, thus effectuating a contribution to the perpendicular demagnetization field $H_{demag}^{eff}$ of the free layer and enhancing the voltage-controlled magnetic anisotropy (VCMA) effect of the 3-terminal MTJ device. This thin transition metal layer may not exhibit a significant spin Hall effect and is provided between the free magnetic layer and the SHE metal layer as a mechanism to engineer an effective 3-terminal MTJ for dual controls based SHE and VCMA effects. The combined structure of the thin transition metal layer and the SHE metal layer can be treated as a composite SHE metal layer. As a specific example, a 3-terminal MTJ device based on an in-plane free magnetic layer having FeCoB was fabricated to include a layer of beta W (4 nm) as the SHE metal layer and a layer of Hf (1 nm) as the thin transition metal layer. Conducted measurements of this MTJ device show both strong SHE and VCMA effects. In addition, the thin transition metal layer between the free magnetic layer and the SHE metal layer in FIG. 19 can be used for enhancing the perpendicular anisotropy of the FL layer of MTJ devices where both the FL and PL layers have perpendicular magnetization directions as shown in FIGS. 12A and 12B.

In at least some of the above 3-terminal MTJ examples, the interface between the SHE metal layer and the free magnetic layer of the MTJ is electrically conductive due to the fact that the either the free layer in direct contact with the SHE metal layer or the thin transition metal layer in FIG. 19 is electrically conducting. Such configurations produce a shunt path so that the charge current that is supplied by the second and third terminals into the SHE metal layer is leaked into the shunt path. This leaking causes the actual charge current that stays within the SHE metal layer to reduce and this reduction, undesirably, reduces the spin-polarized current generated by the SHE effect. For 3-terminal MTJ devices that use SHE metal layers with high resistivity, this undesired leaking of the charge current can be significant. To ensure efficient generation of the spin-polarized current in the SHE metal layer, a thin magnetic insulator layer may be inserted between the MTJ stack and the SHE metal layer to prevent or reduce leaking of the charge current in the SHE metal layer into the MTJ stack. The thickness of the thin magnetic insulator layer is sufficiently small to allow tunneling of electrons since a sensing current needs to pass through the MTJ stack for various circuit operations, including read operations of a MTJ memory cell and generation of oscillation signals in STNO circuits described above. This thin magnetic insulator layer is a magnetic layer that reduces the relaxation effect on the spin-polarized current from the SHE metal layer generated from the spin Hall effect. This thin magnetic insulator layer can be a ferromagnetic or ferrimagnetic insulator layer. Various magnetic insulator materials can be used as the thin magnetic insulator layer, e.g., YIG (Yttrium Iron Garnet) and others.

Figure 20A:
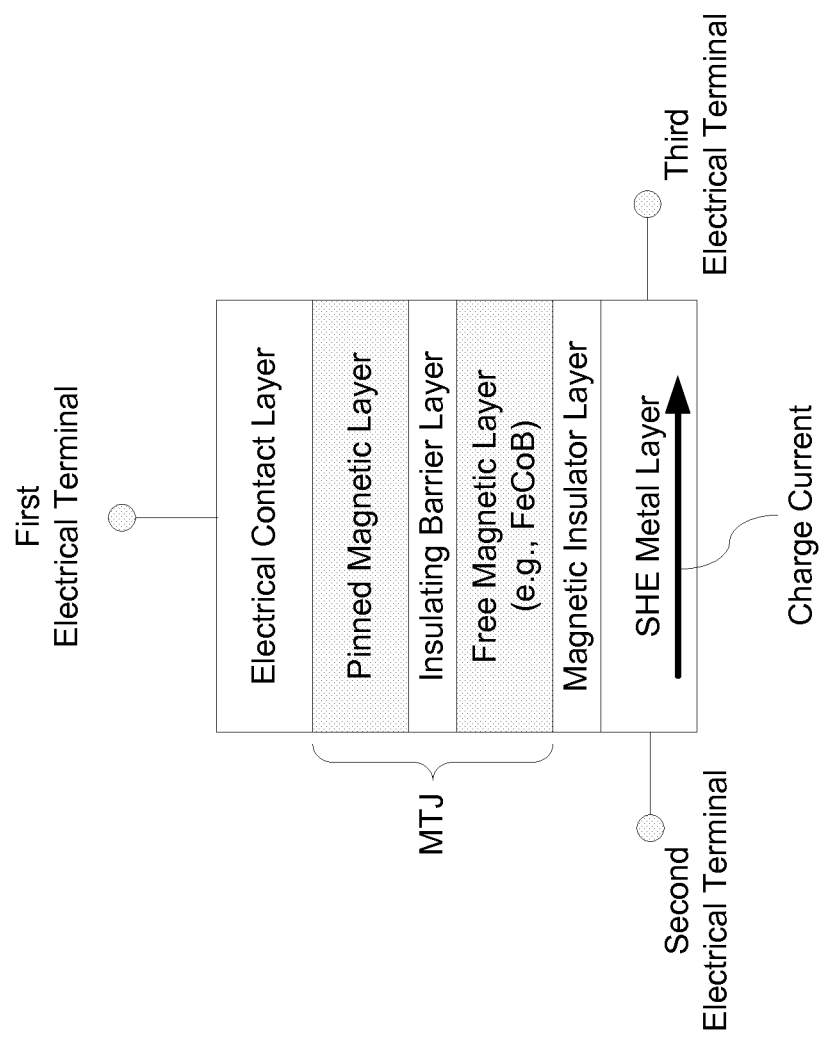
FIGS. 20A and 20B show two examples of 3-terminal MTJ devices having a thin magnetic insulator layer between the free magnetic layer and the SHE metal layer for reducing leaking of the charge current in the SHE metal layer into the electrically conductive free magnetic layer.
Figure 20B:
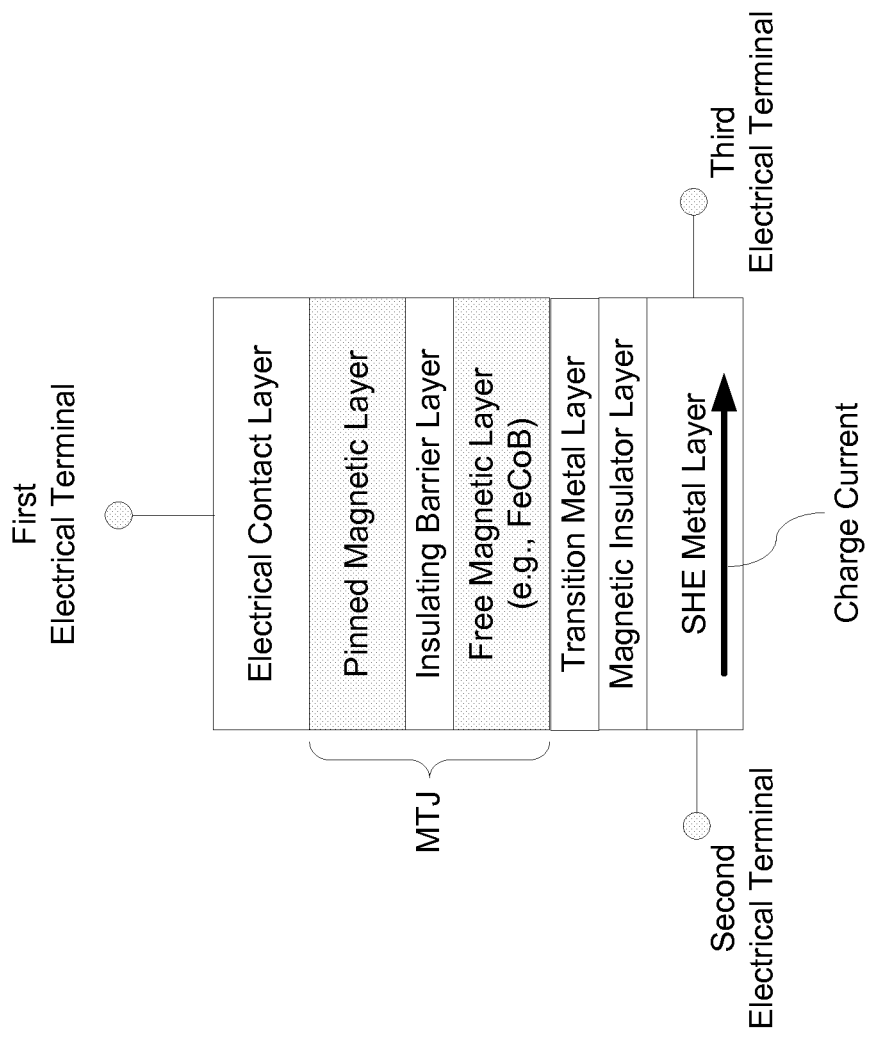

FIGS. 20A and 20B show two examples of 3-terminal MTJ devices implementing the above thin magnetic insulator layer. In FIG. 20A, the thin magnetic insulator layer is placed between the free magnetic layer and the SHE metal layer. In FIG. 20B, the thin magnetic insulator layer is placed between the thin transition metal layer in FIG. 19 and the SHE metal layer. In both examples, the thin magnetic insulator layer reduces the leaking of the charge current in the SHE metal layer into the MTJ stack and enhances the generation of the spin-polarized current entering the MTJ stack.

While this patent document and attachment contain many specifics, these should not be construed as limitations on the scope of any invention or of what may be claimed, but rather as descriptions of features that may be specific to particular embodiments of particular inventions. Certain features that are described in this patent document and attachment in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attachment should not be understood as requiring such separation in all embodiments.

Only a few implementations and examples are described and other implementations, enhancements and variations can be made based on what is described and illustrated in this patent document and attachment.

What is claimed is what is described and illustrated, including:

1. A device based on a spin Hall effect and spin-transfer torque (STT) effect, comprising:
    a magnetic tunneling junction (MTJ) element including a free magnetic layer, a fixed magnetic layer, and a tunnel barrier layer sandwiched between the free magnetic layer and the fixed magnetic layer, the free magnetic layer structured to have a magnetization direction that can be changed by spin-transfer torque;
    an electrically conducting magnetic layer structure exhibiting a spin Hall effect (SHE) and, in response to an applied in-plane charge current, generating a spin-polarized current of a magnetic moment oriented in a predetermined direction having both an in-plane magnetic moment component parallel to a surface of the electrically conducting magnetic layer structure and a perpendicular magnetic moment component perpendicular to the surface of the electrically conducting magnetic layer structure; and
    wherein the magnetization direction of the free magnetic layer is capable of being switched by the spin-polarized current via a spin-transfer torque (STT) effect.

2. The device of claim 1, wherein both the free magnetic layer and the fixed magnetic layer have perpendicular magnetic anisotropy.

3. The device of claim 1, wherein both the free magnetic layer and the fixed magnetic layer have in-plane magnetic anisotropy.

4. The device of claim 1, wherein the electrically conducting magnetic layer structure has a thickness that is less than or equal to five times of a spin diffusion length of the electrically conducting magnetic layer structure but greater than the spin relaxation length.

5. The device of claim 1, wherein the predetermined direction and the surface of the electrically conducting magnetic layer structure form an out-of-plane angle between 0 and 90 degrees.

6. The device of claim 5, wherein the out-of-plane angle is 45 degrees.

7. The device of claim 1, wherein the electrically conducting magnetic layer structure includes a ferromagnetic material that exhibits a magnetization in the predetermined direction.

8. The device of claim 1, wherein the electrically conducting magnetic layer structure includes a ferrimagnetic material that exhibits a magnetization in the predetermined direction.

9. The device of claim 1, further comprising:
    a first electrical contact layer in contact with the fixed magnetic layer;
    a second electrical contact in contact with a first location of the electrically conducting magnetic layer structure;
    a third electrical contact in contact with a second location of the electrically conducting magnetic layer structure, wherein the first and second locations on two sides of the MTJ element;
    a MTJ circuit coupled between the first electrical contact and one of the second and third electrical contacts to supply a sensing current or a voltage to the MTJ element; and
    a charge current circuit coupled between the second and third electrical contacts to supply the in-plane charge current into the electrically conducting magnetic layer structure.

10. The device of claim 1, further comprising:
    a non-magnetic spacer layer which is sandwiched between the free magnetic layer of the MTJ element and the electrically conducting magnetic layer structure, wherein the non-magnetic spacer layer is structured to transmit the spin-polarized current generated by the electrically conducting magnetic layer structure to the free magnetic layer to apply a spin-transfer torque orientated in the predetermined direction on the free magnetic layer.

11. The device of claim 1, wherein:
the electrically conducting magnetic layer structure includes a material that is electrically conducting, is magnetic to have a magnetization along the predetermined direction, and exhibits the spin Hall effect (SHE).

12. The device of claim 1, wherein:
the electrically conducting magnetic layer structure includes a non-magnetic layer that is electrically conducting and exhibits the spin Hall effect (SHE), and a magnetic layer that has a magnetization along the predetermined direction as a spin filter.

13. The device of claim 1, wherein:
the magnetic free layer includes two magnetic domains having opposite magnetization directions and a magnetic domain wall between the two magnetic domains is changeable in position within the magnetic free layer in response to the spin-polarized current.

14. The device of claim 13, wherein the magnetic domains have magnetization directions that are parallel to the magnetic free layer.

15. The device of claim 13, wherein the magnetic domains have magnetization directions that are perpendicular to the magnetic free layer.

16. A magnetic tunneling junction memory device based on a spin Hall effect and spin-transfer torque (STT) effect in a three-terminal circuit configuration, comprising:
an array of memory cells for storing data; and
a memory control circuit coupled to the array of memory cells and operable to read or write data in the memory cells,
wherein each memory cell includes:
  a magnetic tunneling junction (MTJ) that includes (1) a pinned magnetic layer having a fixed magnetization direction, (2) a free magnetic layer having a magnetization direction that is changeable, and (3) a non-magnetic junction layer between the magnetic free layer and the pinned magnetic layer and formed of an insulator material sufficiently thin to allow tunneling of electrons between the magnetic free layer and the pinned magnetic layer;
  a spin Hall effect metal layer structure that includes a metal exhibiting a large spin Hall effect to react to a charge current directed into the spin Hall effect metal layer to produce a spin-polarized current that is perpendicular to the charge current and has spin polarization components that are perpendicular and parallel to the layers of MTJ, the spin Hall effect metal layer structure being parallel to and adjacent to the free magnetic layer to direct the spin-polarized current generated in the spin Hall effect metal layer into the free magnetic layer;
  a first electrical terminal in electrical contact with the MTJ from a side having the pinned magnetic layer; and
  second and third electrical terminals in electrical contact with two contact locations of the spin Hall effect metal layer structure on two opposite sides of the free magnetic layer to supply the charge current in the spin Hall effect metal layer structure; and wherein the memory control circuit is configured to be operable in a writing mode to apply the charge current in the spin Hall effect metal layer structure to set or switch the magnetization direction of the free magnetic layer to a desired direction for representing a stored bit, and
wherein the memory control circuit is further configured to be operable in a read mode to apply a read voltage to the first electrical terminal to supply a read current tunneling across the MTJ between the first electrical terminal and the spin Hall effect metal layer structure, without switching the magnetization direction of the free magnetic layer, to sense the magnetization direction of the free magnetic layer that represents the stored bit in the MTJ.

17. The device as in claim 16, wherein:
the first electrical terminal is in electrical contact with the MTJ from a side having the pinned magnetic layer to receive a gate voltage that modifies a current threshold of a spin-polarized current flowing across the MTJ for switching the magnetization of the free magnetic layer; and
the memory control circuit is coupled to the first, second and third electrical terminals to supply (1) the charge current via the second and third electrical terminals in the spin Hall effect metal layer and (2) the gate voltage across the MTJ causing a small current tunneling across the MTJ that is insufficient to switch the magnetization of the free magnetic layer without collaboration of the spin-polarized current flowing across the free magnetic layer caused by the charge current,
wherein the memory control circuit is configured to be operable in a writing mode to simultaneously apply the charge current in the spin Hall effect metal layer and the gate voltage across the MTJ to set or switch the magnetization direction of the free magnetic layer to a desired direction for representing a stored bit.

18. The device as in claim 17, wherein:
the memory cells are arranged in rows and columns,
the device comprises row spin Hall effect metal stripes, each row spin Hall effect metal stripe being configured to be in contact with a row of memory cells as the spin Hall effect metal layer for each memory cell in the row of memory cells and further coupled to the memory control circuit to carry a row charge current as the charge current for each memory cell in the row of memory cells, and
the device comprises column conductive stripes, each column conductive stripe being configured to be in contact with a column of memory cells respectively located in different rows of memory cells and further coupled to the memory control circuit to apply a row gate voltage as the gate voltage, or a row read voltage as the read voltage, for each memory cell in the column of memory cells.

19. The device as in claim 18, wherein:
the memory control circuit includes:
  a plurality of first transistors coupled to the column conductive stripes, respectively, one first transistor per column conductive stripe to apply the row gate voltage or the row read voltage to the first electrical terminals of the memory cells; and
  a plurality of second transistors coupled to the row spin Hall effect metal stripes, respectively, one second transistor per row spin Hall effect metal stripe to connect to the second electrical terminals to switch on or off the row charge current in the respective row spin Hall effect metal stripe as the charge current for each memory cell in a corresponding row of memory cells.

20. The device as in claim 19, wherein:
the memory control circuit includes a plurality of third transistors coupled to the row spin Hall effect metal stripes, respectively, one third transistor per row spin Hall effect metal stripe to connect between the third electrical terminals of memory cells in a corresponding row of memory cells and an electrical ground.

21. The device as in claim 20, wherein:
the memory control circuit is configured to, in reading a selected memory cell, (1) turn on all of the first transistors to apply the row read voltage to the first electrical terminals of all of the memory cells, (2) turn off all of the second transistors and (3) turn on one third transistor in a corresponding row spin Hall effect metal stripe in contact with the selected memory cell while turning off other third transistors.

22. The device as in claim 20, wherein:
the memory control circuit is configured to, in writing to a selected memory cell, (1) turn on one first transistor coupled to a column conductive stripe in contact with the selected memory cell while turning off other first transistors to apply the row gate voltage to the first electrical terminal of the selected memory cell, and (2) turn on one second transistor and one third transistor in one row spin Hall effect metal stripe in contact with the selected memory cell while turning off other second and third transistors.

23. The device as in claim 17, wherein:
the memory control circuit includes a first transistor coupled to the first electrical terminal and operable to turn on or off the gate voltage or the read voltage applied to the first electrical terminal, a second transistor coupled to the second electrical terminal to turn on or off the charge current in the spin Hall effect metal layer for each memory cell.

24. The device as in claim 16, wherein:
the spin Hall effect metal layer structure has a thickness that is less than or equal to five times of a spin diffusion length of the spin Hall effect metal layer structure.

25. The device as in claim 24, wherein:
the spin Hall effect metal layer structure has a thickness greater than a spin relaxation length of the spin Hall effect metal layer structure.

26. The device as in claim 16, wherein:
the spin Hall effect metal layer structure is configured to exhibit a spin Hall angle greater than 0.05.

27. The device as in claim 16, wherein:
each of the pinned and free magnetic layers has a magnetization direction parallel to the layer.

28. The device as in claim 16, wherein:
each of the pinned and free magnetic layers has a magnetization direction perpendicular to the layer.

29. The device as in claim 28, comprising:
a magnetic mechanism to produce a magnetic bias field at the free magnetic layer and in a field direction parallel to the free magnetic layer.

30. The device as in claim 16, wherein:
the spin Hall effect metal layer structure is in contact with the free magnetic layer.

31. The device as in claim 16, comprising:
a transition metal layer in contact with and between the free magnetic layer and the spin Hall effect metal layer structure to effectuate an interfacial anisotropy at the free magnetic layer.

32. The device as in claim 16, comprising:
a magnetic insulator layer in contact with and between the free magnetic layer and the spin Hall effect metal layer structure to prevent the charge current inside the spin Hall effect metal layer from leaking into the free magnetic layer and to allow for tunneling of electrons.

* * * * *